(12) United States Patent
Ahmed et al.

(10) Patent No.: US 9,293,632 B2
(45) Date of Patent: Mar. 22, 2016

(54) PRESSURE TRANSFER PROCESS FOR THIN FILM SOLAR CELL FABRICATION

(71) Applicant: GLOBALFOUNDRIES INC., Grand Cayman (KY)

(72) Inventors: Shafaat Ahmed, Yorktown Heights, NY (US); Hariklia Deligianni, Tenafly, NJ (US); Qiang Huang, Sleepy Hollow, NY (US); Lubomyr T. Romankiw, Briarcliff Manor, NY (US); Raman Vaidyanathan, White Plains, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/030,019

(22) Filed: Sep. 18, 2013

(65) Prior Publication Data

US 2015/0079723 A1 Mar. 19, 2015

(51) Int. Cl.
*H01L 31/18* (2006.01)
*H01L 21/02* (2006.01)

(52) U.S. Cl.
CPC .......... *H01L 31/18* (2013.01); *H01L 21/02425* (2013.01); *H01L 21/02491* (2013.01); *H01L 21/02521* (2013.01); *H01L 21/02568* (2013.01); *H01L 21/02614* (2013.01)

(58) Field of Classification Search
CPC ................ H01L 31/18; H01L 31/0624; H01L 21/76838; H01L 21/21

USPC ....................................................... 438/95, 72
See application file for complete search history.

(56) References Cited

U.S. PATENT DOCUMENTS

| | | | |
|---|---|---|---|
| 8,809,674 B2 * | 8/2014 | Krasnov et al. | 136/255 |
| 2006/0030149 A1 * | 2/2006 | Leith et al. | 438/669 |
| 2007/0111367 A1 * | 5/2007 | Basol | 438/95 |
| 2009/0162969 A1 * | 6/2009 | Basol | 438/95 |
| 2009/0272422 A1 * | 11/2009 | Li | 136/244 |
| 2011/0284134 A1 * | 11/2011 | Nichols et al. | 148/241 |
| 2012/0175248 A1 * | 7/2012 | Vasquez et al. | 204/275.1 |

* cited by examiner

*Primary Examiner* — Marc Armand
*Assistant Examiner* — Christina Sylvia
(74) *Attorney, Agent, or Firm* — Yuanmin Cai; Andrew M. Calderon; Roberts, Mlotkowski, Safran & Cole PC

(57) ABSTRACT

In one aspect, a method for fabricating a thin film solar cell includes the following steps. A first absorber material is deposited as a layer A on a substrate while applying pressure to the substrate/layer A. A second absorber material is deposited as a layer B on layer A while applying pressure to the substrate/layer B. A third absorber material is deposited as a layer C on layer B while applying pressure to the substrate/layer C. A fourth absorber material is deposited as a layer D on layer C while applying pressure to the substrate/layer D. The first absorber material comprises copper, the second absorber material comprises indium, the third absorber material comprises gallium, and the fourth absorber material comprises one or more of sulfur and selenium, and wherein by way of performing the steps of claim 1 a chalcogenide absorber layer is formed on the substrate.

18 Claims, 7 Drawing Sheets

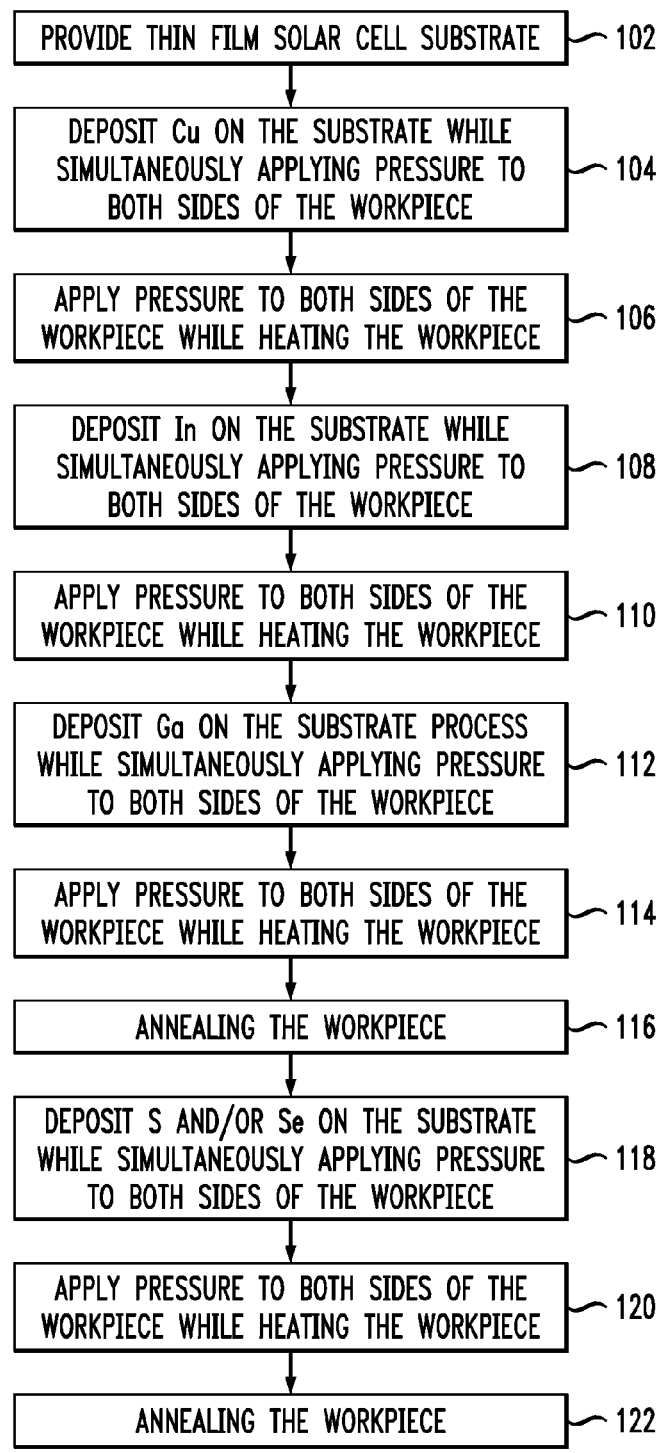

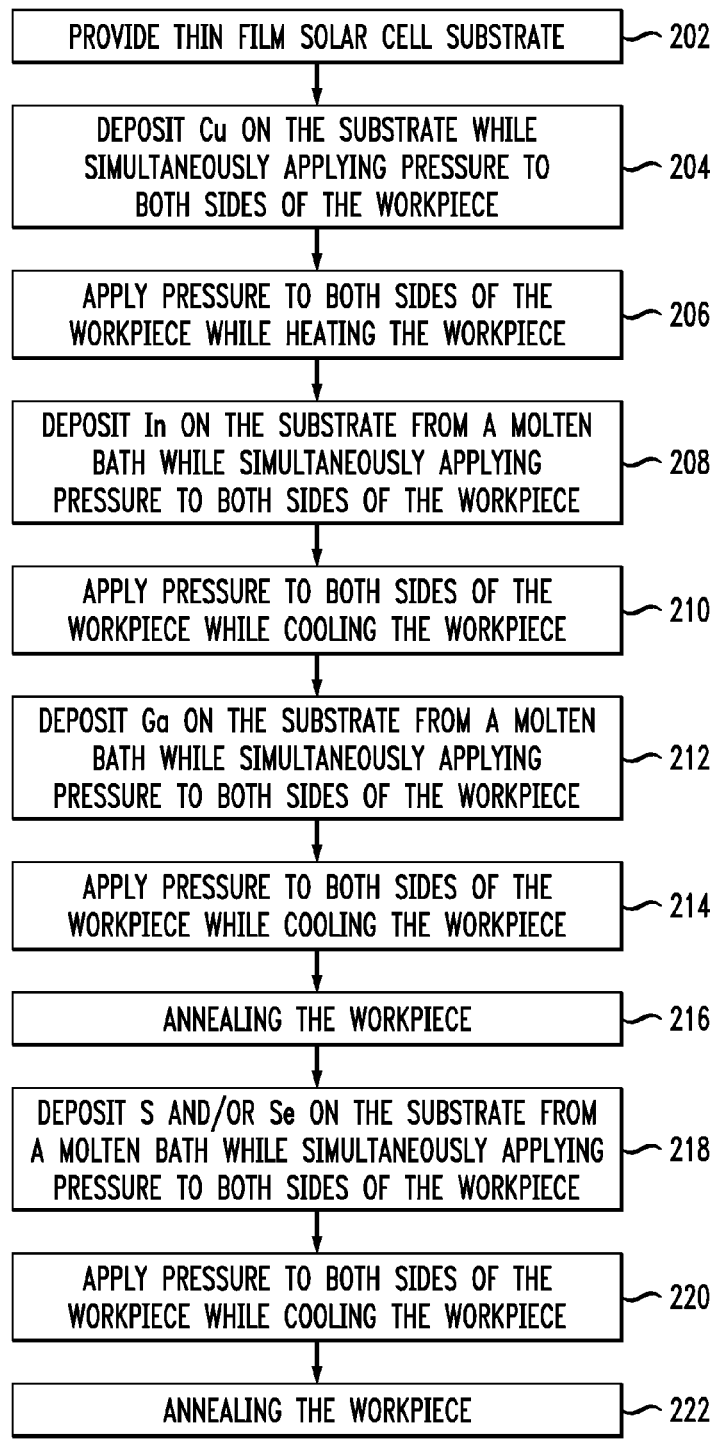

ROLL TO ROLL PRESSURE TRANSFER PROCESS ON GLASS

ROLL TO ROLL PRESSURE TRANSFER PROCESS ON STAINLESS STEEL

ROLL TO ROLL PRESSURE TRANSFER PROCESS FROM MOLTEN BATH

PRESSURE TRANSFER PROCESS FOR THIN FILM SOLAR CELL FABRICATION

FIELD OF THE INVENTION

The present invention relates to the fabrication of copper-indium-gallium-sulfur/selenium (CIGS)-based thin film solar cells and more particularly, to techniques for fabricating CIGS-based thin film solar cells that employ a pressure transfer process to control volume expansion and stresses on the CIGS layers that occur during the fabrication process and thereby prevent loss of adhesion between the layers.

BACKGROUND OF THE INVENTION

Copper-indium-gallium-sulfur/selenium (CIGS) materials are commonly used as the absorber in thin film solar cells. One approach to producing a CIGS absorber in thin film solar cell technology is to successively deposit elemental layers of the copper, indium, gallium and sulfur, followed by an annealing step (for example in a selenium environment).

One challenge in this fabrication process is to maintain adhesion between the deposited layers. Namely, the layers being formed from different materials will have different coefficients of thermal expansion. During the heating and cooling cycles of absorber fabrication, the differing amounts of volume expansion can cause the layers to delaminate. This delamination problem is a significant roadblock to large-scale implementation of CIGS thin film solar cell production.

Thus, techniques for fabricating CIGS thin film solar cells that minimize or eliminate such adhesion problems would be desirable.

SUMMARY OF THE INVENTION

The present invention provides techniques for fabricating CIGS-based thin film solar cells that employ a pressure transfer process to control volume expansion and stresses on the CIGS layers that occur during the fabrication process and thereby prevent loss of adhesion between the layers. In one aspect of the invention, a method for fabricating a thin film solar cell is provided. The method includes the following steps. A substrate is provided. A first absorber material is deposited as a layer A on the substrate while applying pressure to both the substrate and the layer A. A second absorber material is deposited as a layer B on the layer A while applying pressure to both the substrate and the layer B. A third absorber material is deposited as a layer C on the layer B while applying pressure to both the substrate and the layer C. A fourth absorber material is deposited as a layer D on the layer C while applying pressure to both the substrate and the layer D. The layers A-D are annealed while applying pressure to both the substrate and the layer D, wherein the first absorber material comprises copper, the second absorber material comprises indium, the third absorber material comprises gallium, and the fourth absorber material comprises one or more of sulfur and selenium, and wherein by way of performing the steps of the method a chalcogenide absorber layer is formed on the substrate.

In another aspect of the invention, an apparatus for fabricating a thin film solar cell is provided. The apparatus includes a set of rollers (a) configured to, when a substrate passes between the set of rollers (a), deposit a first absorber material as a layer A on the substrate while applying pressure to both the substrate and the layer A; a set of rollers (b) configured to, when the substrate with the layer A thereon passes through the set of rollers (b), deposit a second absorber material as a layer B on the layer A while applying pressure to both the substrate and the layer B; a set of rollers (c) configured to, when the substrate with the layers A and B thereon passes through the set of rollers (c), deposit a third absorber material as a layer C on the layer B while applying pressure to both the substrate and the layer C; a set of rollers (d) configured to, when the substrate with the layers A-C thereon passes through the set of rollers (d), deposit a fourth absorber material as a layer D on the layer C while applying pressure to both the substrate and the layer D; and a set of rollers (e) configured to, when the substrate with the layers A-D thereon passes through the set of rollers (e), anneal the layers A-D while applying pressure to both the substrate and the layer D, wherein the first absorber material comprises copper, the second absorber material comprises indium, the third absorber material comprises gallium, and the fourth absorber material comprises one or more of sulfur and selenium, and wherein the apparatus is configured to form a chalcogenide absorber layer on the substrate.

A more complete understanding of the present invention, as well as further features and advantages of the present invention, will be obtained by reference to the following detailed description and drawings.

BRIEF DESCRIPTION OF THE DRAWINGS

FIG. 1 is a diagram illustrating an exemplary methodology for fabrication of thin film solar cells according to an embodiment of the present invention;

FIG. 2 is a diagram illustrating another exemplary methodology for fabrication of thin film solar cells according to an embodiment of the present invention;

DETAILED DESCRIPTION OF PREFERRED EMBODIMENTS

Figure 3A:
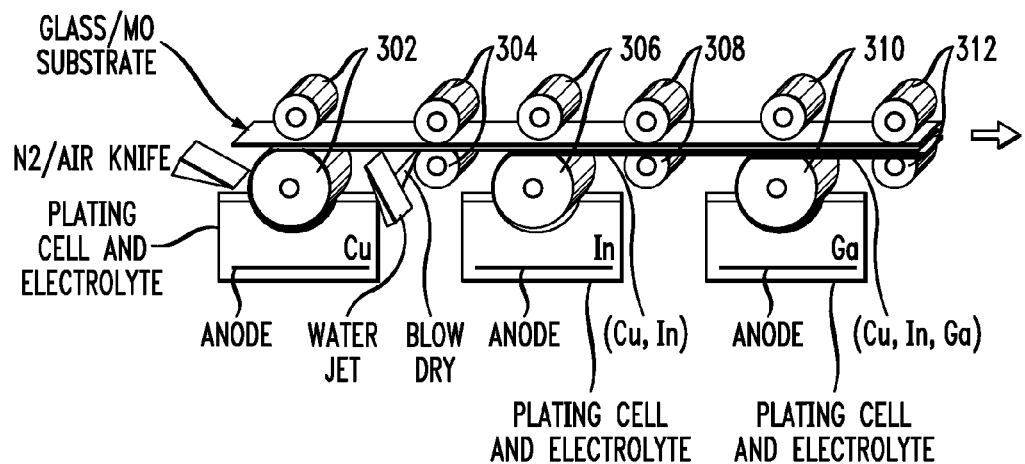
FIGS. 3A-B are diagrams illustrating a continuous line processing apparatus for fabricating thin film solar cells according to the method of FIG. 1 according to an embodiment of the present invention.

As provided above, the fabrication of copper-indium-gallium-sulfur/selenium (CIGS) absorbers for thin film solar cell production can be accomplished by successive deposition of elemental layers of the copper (Cu), indium (In), gallium (Ga) and sulfur (S), followed by an anneal in a selenium (Se) environment. However due to the differences in material composition, adhesion problems can occur during the fabrication process as the layers are heated and cooled. Advantageously, provided herein are techniques for fabricating chalcogenide (e.g., CIGS) thin film solar cells that employ a pressure transfer process, for example by way of rollers that apply pressure to both sides of the solar cell workpiece, to control volume expansion and stresses on the CIGS layers that occur during the fabrication process and thereby prevent loss of adhesion between the layers.

In one exemplary embodiment which will be described in detail below, the present techniques are applied to a continuous line chalcogenide (e.g., CIGS) thin film solar cell fabrication process wherein the elemental layers of the CIGS absorber are successively applied to a substrate (e.g., molybdenum (Mo)-coated glass or metal substrate) material that is being continuously fed through the production line. The thin film layers of the absorber are applied at different stages of the continuous line process. In some exemplary embodiments, described below, sets of rollers are employed throughout the fabrication stages to deposit the CIGS layers onto the workpiece and/or heat/cool the workpiece while at the same time applying pressure to both sides of the workpiece. Applying pressure to both sides of the workpiece during the thin film fabrication process serves to passivate the stresses caused by the volume expansion of the layers. Thus, the above-described adhesion problems commonly associated with conventional thin film solar cell fabrication can be avoided.

According to the present techniques, deposition of the CIGS layers onto the workpiece can be carried out in several different ways. For example, in one scenario an electrodeposition process is used to deposit the CIGS layers using separate electroplating cells. As will be described in detail below, the rollers can be used during this electrodeposition process to simultaneously apply pressure to both sides of the workpiece while serving to deposit the CIGS material onto the workpiece (and at some stages of the process heat or cool the workpiece). In another exemplary scenario, one or more of the CIGS components are deposited onto the workpiece from a molten bath. Again, the rollers can be used during this molten deposition process to simultaneously apply pressure to both sides of the workpiece while serving to deposit the CIGS material onto the workpiece (and at some stages of the process heat or cool the workpiece).

An overview of the first exemplary scenario wherein the CIGS materials are deposited onto the workpiece via electrodeposition is provided by way of reference to FIG. 1. Then an overview of the exemplary scenario wherein one or more of the CIGS materials are deposited from a molten bath is provided by way of reference to FIG. 2. Exemplary continuous line thin film production apparatuses which may be employed to implement the present techniques will then be shown and described by way of reference to FIGS. 3-5.

FIG. 1 is a diagram illustrating an exemplary methodology 100 for fabrication of CIGS thin film solar cells employing electrodeposition. While the present techniques are being described in the context of fabricating a solar cell, in theory the same techniques may be applied in any continuous line thin film fabrication process. In step 102, a substrate material is provided. Suitable substrate materials for solar cell applications include, but are not limited to, glass substrates having a back contact layer formed thereon such as a molybdenum (Mo)-coated glass substrate, and a flexible metal substrate, such as a stainless steel foil substrate. In the exemplary embodiments described below, the substrate material is fed continuously from a roll, the CIGS absorber material is formed on the substrate material, and the output is spooled onto a second roll. This process is also referred to herein as a roll-to-roll process.

Next, in step 104 a Cu layer is deposited onto the substrate material. It is notable that in the case of a Mo-coated glass substrate, in this step the Cu is deposited onto the Mo layer. In order to control volume expansion and stresses on the layers of the cell, pressure is applied to both sides (i.e., to a top and bottom—to the substrate and Cu layer, respectively) of the workpiece during this Cu deposition step. By way of example only, a linear pressure applied to the workpiece during this step is from about 10 N/mm to about 700 N/mm.

As will be described in detail below, in some exemplary embodiments, the Cu deposition and simultaneous application of pressure to the workpiece is performed via a set of two rollers that are in contact with opposing sides (i.e., one roller is in contact with the top and one roller is in contact with the bottom) of the workpiece such that as the workpiece is fed through the continuous line fabrication process, the workpiece passes between the set of rollers.

According to an exemplary embodiment, the rollers are configured to deposit the Cu onto the workpiece from a Cu-containing electrochemical electrolyte solution through which one of the rollers passes. Namely, the Cu (which is electrodeposited onto the roller from the electrolyte solution) is transferred from the roller onto the workpiece. The transfer of the Cu from the roller to the workpiece can be facilitated by cooling the roller, see below. Namely, as will be described in detail below, the rollers may be made of a metal such as stainless steel. The material (in this case Cu) will be deposited via the rollers onto the substrate under pressure—as provided above. Cooling the rollers will facilitate cladding the Cu to the workpiece, rather than to the (metal) roller. Further, due to this being a continuous line process, as the workpiece passes through each stage, the material already deposited and cladded onto the workpiece will aid in removing the material from the roller (similar to when any sort of material is unwound from a roll) and cooling the rollers facilitates removal of the material from the roll. Thus, in one exemplary embodiment, the rollers are in this step cooled to a temperature of from about −5° C. to about 10° C. Thus, in this exemplary embodiment, the rollers are configured to simultaneously 1) apply Cu to the workpiece and 2) apply pressure to both sides of the workpiece. Pressure is defined herein as a physical force being exerted on a first object (in this case the workpiece) by one or more other objects (in this case the rollers) in contact with the first object. As the CIGS absorber layers are successively deposited onto the substrate, pressure is applied to the workpiece via the rollers which are in contact with the substrate and the layer currently being deposited. Thus, during the Cu deposition step, pressure from the rollers is exerted simultaneously on the Cu layer and on the substrate. During the In deposition step, pressure from the rollers is exerted simultaneously on the In layer and on the substrate. And so on.

As will be described in detail below, electrodeposition is only one possible process that may be implemented to deposit the thin film materials onto the substrate. For instance, the Cu can be deposited onto the rollers using for example a sputtering (or other suitable process) and then transferred from the rollers to the substrate in the manner described above. Alternatively, the Cu can be deposited directly onto the substrate and pressure/heat would be applied via the rollers in the manner described above. These alternative embodiments are described in detail below.

In order to bond the Cu deposited onto the substrate material in step 104, pressure and heat are applied to the workpiece in step 106. This process of bonding dissimilar metals (e.g., the Cu with the metal substrate or with the Mo-coated substrate) is also referred to herein by the term "cladding." Linear pressure (e.g., from about 10 N/mm to about 700 N/mm) is applied to both sides (i.e., to a top and bottom—to the Cu layer and substrate, respectively) of the workpiece during this step which, as provided above, also serves to control volume expansion and stresses on the layers of the cell. By way of example only, the workpiece may be heated at this step to a temperature of from about 50° C. to about 250° C.

As will be described in detail below, in some exemplary embodiments, the heating and simultaneous application of pressure to the workpiece is performed in step 106 via a set of two rollers that are in contact with opposing sides (i.e., one roller is in contact with the top and one roller is in contact with the bottom) of the workpiece such that as the workpiece is fed through the continuous line fabrication process, the workpiece passes between the set of rollers. The rollers can be heated to thereby heat the workpiece as the workpiece passes between the rollers. Thus, in this exemplary embodiment, the rollers at this stage of the continuous line process are configured to simultaneously 1) heat the workpiece and 2) apply pressure to both sides of the workpiece.

Next, in step 108 an In layer is deposited onto the substrate material on top of the Cu layer. In order to control volume expansion and stresses on the layers of the cell, pressure is applied to both sides (i.e., to a top and bottom—to the substrate and In layer, respectively) of the workpiece during this In deposition step. Exemplary pressure values that may be employed during this metal deposition step were provided above.

As will be described in detail below, in some exemplary embodiments, the In deposition and simultaneous application of pressure to the workpiece is performed via another set of rollers that are in contact with opposing sides (i.e., one roller is in contact with the top and one roller is in contact with the bottom) of the workpiece such that as the workpiece is fed through the continuous line fabrication process, the workpiece passes between the set of rollers. The rollers can be configured to deposit the In onto the workpiece from a In-containing electrochemical electrolyte solution through which one of the rollers passes. Namely, the In (which is electrodeposited onto the roller from the electrolyte solution) is transferred from the roller onto the workpiece. As with the case of the Cu deposition above, the transfer of the In from the roller to the workpiece can be facilitated by cooling the roller, see below. Exemplary temperature values were provided above regarding cooling the workpiece to facilitate material transfer from the rollers to the workpiece. Thus, in this exemplary embodiment, the rollers are configured to simultaneously 1) apply In to the workpiece, and 2) apply pressure to both sides of the workpiece.

Cladding of the In deposited onto the Cu layer (in step 108) is achieved by applying pressure and heat to the workpiece in step 110. Exemplary temperature and pressure values for this cladding process were provided above.

Alternatively, as provided above, electrodeposition is only one exemplary process that may be employed herein for depositing the material onto the substrate. For instance, another suitable deposition process (such as sputtering) may be used to deposit the material onto the rollers, which then apply the material to the substrate in the manner described above. Alternatively, the material may be deposited directly onto the substrate with pressure and/or heat being supplied via the rollers as described above. These alternative embodiments are described in detail below.

As will be described in detail below, in some exemplary embodiments, the heating and simultaneous application of pressure to the workpiece is performed in step 110 via another set of rollers that are in contact with opposing sides (i.e., one roller is in contact with the top and one roller is in contact with the bottom) of the workpiece such that as the workpiece is fed through the continuous line fabrication process, the workpiece passes between the set of rollers. The rollers can be heated to thereby heat the workpiece as the workpiece passes between the rollers. Thus, in this exemplary embodiment, the rollers at this stage of the continuous line process are configured to simultaneously 1) heat the workpiece and 2) apply pressure to both sides of the workpiece.

Next, in step 112 a Ga layer is deposited onto the substrate material on top of the In layer. In order to control volume expansion and stresses on the layers of the cell, pressure is applied to both sides (i.e., to a top and bottom—to the substrate and Ga layer, respectively) of the workpiece during this Ga deposition step. Exemplary pressure values that may be employed during this metal deposition step were provided above.

As will be described in detail below, in some exemplary embodiments, the Ga deposition and simultaneous application of pressure to the workpiece is performed via another set of rollers that are in contact with opposing sides (i.e., one roller is in contact with the top and one roller is in contact with the bottom) of the workpiece such that as the workpiece is fed through the continuous line fabrication process, the workpiece passes between the set of rollers. The rollers can be configured to deposit the Ga onto the workpiece from a Ga-containing electrochemical electrolyte solution through which one of the rollers passes. Namely, the Ga (which is electrodeposited onto the roller from the electrolyte solution) is transferred from the roller onto the workpiece. As with the materials above, the transfer of the Ga from the roller to the workpiece can be facilitated by cooling the roller, see below. Thus, in one exemplary embodiment, the rollers are in this step are cooled. Exemplary temperature values were provided above regarding cooling the workpiece to facilitate material transfer from the rollers to the workpiece. Thus, in this exemplary embodiment, the rollers are configured to simultaneously 1) apply Ga to the workpiece, and 2) apply pressure to both sides of the workpiece.

Cladding of the Ga deposited onto the In layer (in step 112) is achieved by applying pressure and heat to the workpiece in step 114. Exemplary temperature and pressure values for this cladding process were provided above.

Alternatively, as provided above, electrodeposition is only one exemplary process that may be employed herein for depositing the material onto the substrate. For instance, another suitable deposition process (such as sputtering) may be used to deposit the material onto the rollers, which then apply the material to the substrate in the manner described above. Alternatively, the material may be deposited directly onto the substrate with pressure and/or heat being supplied via the rollers as described above. These alternative embodiments are described in detail below.

As will be described in detail below, in some exemplary embodiments, the heating and simultaneous application of pressure to the workpiece is performed in step 114 via another set of rollers that are in contact with opposing sides (i.e., one roller is in contact with the top and one roller is in contact with the bottom) of the workpiece such that as the workpiece is fed through the continuous line fabrication process, the workpiece passes between the set of rollers. The rollers can be heated to thereby heat the workpiece as the workpiece passes between the rollers. Thus, in this exemplary embodiment, the rollers at this stage of the continuous line process are configured to simultaneously 1) heat the workpiece and 2) apply pressure to both sides of the workpiece.

In step 116, the workpiece is subjected to an intermediate or soft anneal. As with the heating steps described above, pressure is applied to the workpiece while the workpiece is heated during step 116. While the soft anneal performed in step 116 is optional, uniformity of the final CIGS material will be enhanced by performing this soft/intermediate anneal. According to an exemplary embodiment, in step 116 the workpiece is annealed at a temperature of from about 100° C. to about 300° C., e.g., at a temperature of about 155° C., while a linear pressure of from about 10 N/mm to about 700 N/mm is simultaneously applied to both sides (i.e., to a top and bottom) of the workpiece which, as provided above, also serves to control volume expansion and stresses on the layers of the cell. As will be described below, a final anneal will be performed in an S-containing environment to complete the CIGS absorber.

As will be described in detail below, in some exemplary embodiments, the heating and simultaneous application of pressure to the workpiece is performed in step 116 via another set of rollers that are in contact with opposing sides (i.e., one roller is in contact with the top and one roller is in contact with the bottom) of the workpiece such that as the workpiece is fed through the continuous line fabrication process, the workpiece passes between the set of rollers. The rollers can be heated to thereby heat the workpiece as the workpiece passes between the rollers. Thus, in this exemplary embodiment, the rollers at this stage of the continuous line process are configured to simultaneously 1) heat the workpiece and 2) apply pressure to both sides of the workpiece.

Next, in step 118 a S, Se, or S+Se layer (abbreviated herein as S/Se layer) is deposited onto the substrate material on top of the Ga layer. In order to control volume expansion and stresses on the layers of the cell, pressure is applied to both sides (i.e., to a top and bottom—to the substrate and S/Se layer, respectively) of the workpiece during this S/Se deposition step. Exemplary pressure values that may be employed during this metal deposition step were provided above.

As will be described in detail below, in some exemplary embodiments, the S/Se deposition and simultaneous application of pressure to the workpiece is performed via another set of rollers that are in contact with opposing sides (i.e., one roller is in contact with the top and one roller is in contact with the bottom) of the workpiece such that as the workpiece is fed through the continuous line fabrication process, the workpiece passes between the set of rollers. The rollers can be configured to deposit the S/Se onto the workpiece from a S/Se-containing electrochemical electrolyte solution through which one of the rollers passes. Namely, the S/Se (which is electrodeposited onto the roller from the electrolyte solution) is transferred from the roller onto the workpiece. As with the materials above, the transfer of the S/Se from the roller to the workpiece can be facilitated by cooling the roller, see below. Thus, in one exemplary embodiment, the rollers are in this step cooled. Exemplary temperature values were provided above regarding cooling the workpiece to facilitate material transfer from the rollers to the workpiece. Thus, in this exemplary embodiment, the rollers are configured to simultaneously 1) apply S/Se to the workpiece, and 2) apply pressure to both sides of the workpiece.

Cladding of the S/Se deposited onto the Ga layer (in step 118) is achieved by applying pressure and heat to the workpiece in step 120. Exemplary temperature and pressure values for this cladding process were provided above.

As provided above, electrodeposition is only one exemplary process that may be employed herein for depositing the material onto the substrate. For instance, another suitable deposition process (such as sputtering) may be used to deposit the material onto the rollers, which then apply the material to the substrate in the manner described above. Alternatively, the material may be deposited directly onto the substrate with pressure and/or heat being supplied via the rollers as described above. These alternative embodiments are described in detail below.

As will be described in detail below, in some exemplary embodiments, the heating and simultaneous application of pressure to the workpiece is performed in step 120 via another set of rollers that are in contact with opposing sides (i.e., one roller is in contact with the top and one roller is in contact with the bottom) of the workpiece such that as the workpiece is fed through the continuous line fabrication process, the workpiece passes between the set of rollers. The rollers can be heated to thereby heat the workpiece as the workpiece passes between the rollers. Thus, in this exemplary embodiment, the rollers at this stage of the continuous line process are configured to simultaneously 1) heat the workpiece and 2) apply pressure to both sides of the workpiece.

Finally, in step 122, the workpiece is subjected to a final anneal in a S environment. As with the heating steps described above, pressure is applied to the workpiece while the workpiece is heated during step 122. According to an exemplary embodiment, in step 122 the workpiece is annealed at a temperature of from about 500° C. to about 600° C., e.g., at a temperature of about 500° C., while a linear pressure of from about 10 N/mm to about 700 N/mm is simultaneously applied to both sides (i.e., to a top and bottom) of the workpiece which, as provided above, also serves to control volume expansion and stresses on the layers of the cell.

As will be described in detail below, in some exemplary embodiments, the heating and simultaneous application of pressure to the workpiece is performed in step 122 via another set of rollers that are in contact with opposing sides (i.e., one roller is in contact with the top and one roller is in contact with the bottom) of the workpiece such that as the workpiece is fed through the continuous line fabrication process, the workpiece passes between the set of rollers. The rollers can be heated to thereby heat the workpiece as the workpiece passes between the rollers. Thus, in this exemplary embodiment, the rollers at this stage of the continuous line process are configured to simultaneously 1) heat the workpiece and 2) apply pressure to both sides of the workpiece.

The CIGS absorber is now complete. Any further processing of the cell can be carried out using conventional techniques to form a buffer layer, top electrode, etc. to complete the solar cell.

It is notable that the thin film compositions described above, and elsewhere herein are merely examples intended to illustrate the present techniques, and a variety of other film compositions can be achieved in the manner described herein. One would need only to vary the composition of the materials deposited in one or more of the steps and/or the order in which the materials are deposited in order to achieve different thin film compositions. In addition to the CIGS example provided above, by way of example only, one may adapt the present techniques to produce any of the following thin film solar cell compositions: CZTS ($Cu_2ZnSn(Se,S)_4$), $FeS_2$, $Zn_3P_2$, CdSe, CdS, ZnSe, $WSe_2$, $MoSe_2$, $Bi_2S_3$, $Ag_2S$, $Cu_2Zn(Fe,Sn)(Se,S)_4$, CuxS, CdTe, ZnTe, PbSe, PdS, NiS, NiSeS, InP, ZnO, GaAs. An example involving a I-III-$IV_2$ material is provided below.

As provided above, according to another exemplary scenario, one or more of the CIGS components are deposited onto the workpiece from a molten bath. An overview of this process is now provided by way of reference to FIG. 2. FIG. 2 is a diagram illustrating an exemplary methodology 200 for fabrication of CIGS thin film solar cells wherein one or more of the CIGS materials are deposited from a molten bath. While the present techniques are being described in the context of fabricating a solar cell, in theory the same techniques may be applied in any continuous line thin film fabrication process.

In step 202, a substrate material is provided. Suitable substrate materials for solar cell applications include, but are not limited to, glass substrates having a back contact layer formed thereon such as a Mo-coated glass substrate, and a flexible metal substrate, such as a stainless steel foil substrate. In the exemplary embodiments described below, the substrate material is fed continuously from a roll, the CIGS absorber material is formed on the substrate material, and the output is spooled onto a second roll. This process is also referred to herein as a roll-to-roll process.

Next, in step 204 a Cu layer is deposited onto the substrate material. It is notable that in the case of a Mo-coated glass substrate, in this step the Cu is deposited onto the Mo layer. In order to control volume expansion and stresses on the layers of the cell, pressure is applied to both sides (i.e., to a top and bottom—to the substrate and Cu layer, respectively) of the workpiece during this Cu deposition step. By way of example only, a linear pressure applied to the workpiece during this step is from about 10 N/mm to about 700 N/mm. In this example, the Cu will be deposited in step 204 by electrodeposition from an electrolyte, whereas the In, Ga and S will be deposited from a molten bath.

As will be described in detail below, in some exemplary embodiments, the Cu deposition and simultaneous application of pressure to the workpiece is performed via a set of two rollers that are in contact with opposing sides (i.e., one roller is in contact with the top and one roller is in contact with the bottom) of the workpiece such that as the workpiece is fed through the continuous line fabrication process, the workpiece passes between the set of rollers. The rollers can be configured to deposit the Cu onto the workpiece from a Cu-containing electrolyte solution through which one of the rollers passes. Namely, the Cu (which is electrodeposited onto the roller from the electrochemical electrolyte solution) is transferred from the roller onto the workpiece. As described above, the transfer of the Cu from the roller to the workpiece can be facilitated by cooling the roller. Exemplary temperature values for cooling the rollers to facilitate material transfer from the roller to the workpiece were provided above. Thus, in this exemplary embodiment, the rollers are configured to simultaneously 1) apply Cu to the workpiece, and 2) apply pressure to both sides of the workpiece.

As provided above, electrodeposition is only one exemplary process that may be employed herein for depositing the material onto the substrate. For instance, another suitable deposition process (such as sputtering) may be used to deposit the material onto the rollers, which then apply the material to the substrate in the manner described above. Alternatively, the material may be deposited directly onto the substrate with pressure and/or heat being supplied via the rollers as described above. These alternative embodiments are described in detail below.

In order to bond the Cu deposited onto the substrate material in step 204, pressure and heat are applied to the workpiece in step 206. This process of bonding dissimilar metals (e.g., the Cu with the metal substrate or with the Mo-coated substrate) is also referred to herein by the term "cladding." Linear pressure (e.g., from about 10 N/mm to about 700 N/mm) is applied to both sides (i.e., to a top and bottom) of the workpiece during this step which, as provided above, also serves to control volume expansion and stresses on the layers of the cell. By way of example only, the workpiece may be heated at this step to a temperature of from about 50° C. to about 250° C.

As will be described in detail below, in some exemplary embodiments, the heating and simultaneous application of pressure to the workpiece is performed in step 206 via a set of two rollers that are in contact with opposing sides (i.e., one roller is in contact with the top and one roller is in contact with the bottom) of the workpiece such that as the workpiece is fed through the continuous line fabrication process, the workpiece passes between the set of rollers. The rollers can be heated to thereby heat the workpiece as the workpiece passes between the rollers. Thus, in this exemplary embodiment, the rollers at this stage of the continuous line process are configured to simultaneously 1) heat the workpiece and 2) apply pressure to both sides of the workpiece.

Next, in step 208 an In layer is deposited onto the substrate material on top of the Cu layer. In order to control volume expansion and stresses on the layers of the cell, pressure is applied to both sides (i.e., to a top and bottom—to the substrate and In layer, respectively) of the workpiece during this In deposition step. Exemplary pressure values that may be employed during this metal deposition step were provided above.

As will be described in detail below, in some exemplary embodiments, the In deposition and simultaneous application of pressure to the workpiece is performed via another set of rollers that are in contact with opposing sides (i.e., one roller is in contact with the top and one roller is in contact with the bottom) of the workpiece such that as the workpiece is fed through the continuous line fabrication process, the workpiece passes between the set of rollers. The rollers can be configured to deposit the In onto the workpiece from a bath of molten In through which one of the rollers passes. Namely, as the roller passes through the bath, some of the molten In is picked up by the roller and transferred to the workpiece. Thus, in this exemplary embodiment, the rollers are configured to simultaneously 1) apply In to the workpiece, 2) apply pressure to both sides of the workpiece.

The In material deposited in step 208 will still be (at least to some extent) molten after it is transferred to the workpiece. Thus, in step 210 the workpiece is cooled. In order to control volume expansion and stresses on the layers of the cell, pressure is applied to both sides (i.e., to a top and bottom) of the workpiece during this cooling step. By way of example only, the workpiece is cooled in this step to a temperature of from about −5° C. to about 10° C. and the linear pressure applied to the workpiece during this step is from about 10 N/mm to about 700 N/mm.

As will be described in detail below, in some exemplary embodiments, the cooling and simultaneous application of pressure to the workpiece is performed in step 210 via another set of rollers that are in contact with opposing sides (i.e., one roller is in contact with the top and one roller is in contact with the bottom) of the workpiece such that as the workpiece is fed through the continuous line fabrication process, the workpiece passes between the set of rollers. The rollers can be cooled to thereby cool the workpiece as the workpiece passes between the rollers. Thus, in this exemplary embodiment, the rollers at this stage of the continuous line process are configured to simultaneously 1) cool the workpiece and 2) apply pressure to both sides of the workpiece.

Next, in step 212 a Ga layer is deposited onto the substrate material on top of the In layer. In order to control volume expansion and stresses on the layers of the cell, pressure is applied to both sides (i.e., to a top and bottom—to the substrate and Ga layer, respectively) of the workpiece during this Ga deposition step. Exemplary pressure values that may be employed during this metal deposition step were provided above.

As will be described in detail below, in some exemplary embodiments, the Ga deposition and simultaneous application of pressure to the workpiece is performed via another set of rollers that are in contact with opposing sides (i.e., one roller is in contact with the top and one roller is in contact with the bottom) of the workpiece such that as the workpiece is fed through the continuous line fabrication process, the workpiece passes between the set of rollers. The rollers can be configured to deposit the Ga onto the workpiece from a bath of molten Ga through which one of the rollers passes. Namely, as the roller passes through the bath, some of the molten Ga is picked up by the roller and transferred to the workpiece. Thus, in this exemplary embodiment, the rollers are configured to simultaneously 1) apply Ga to the workpiece, 2) apply pressure to both sides of the workpiece.

The Ga material deposited in step 212 will still be (at least to some extent) molten after it is transferred to the workpiece. Thus, in step 214 the workpiece is cooled. In order to control volume expansion and stresses on the layers of the cell, pressure is applied to both sides (i.e., to a top and bottom) of the workpiece during this cooling step. Exemplary temperature and pressure values for this stage of the process were provided above.

As will be described in detail below, in some exemplary embodiments, the cooling and simultaneous application of pressure to the workpiece is performed in step 212 via another set of rollers that are in contact with opposing sides (i.e., one roller is in contact with the top and one roller is in contact with the bottom) of the workpiece such that as the workpiece is fed through the continuous line fabrication process, the workpiece passes between the set of rollers. The rollers can be cooled to thereby cool the workpiece as the workpiece passes between the rollers. Thus, in this exemplary embodiment, the rollers at this stage of the continuous line process are configured to simultaneously 1) cool the workpiece and 2) apply pressure to both sides of the workpiece.

In step 216, the workpiece is subjected to an intermediate or soft anneal. As with the heating steps described above, pressure is applied to the workpiece while the workpiece is heated during step 216. While the soft anneal performed in step 216 is optional, uniformity of the final CIGS material will be enhanced by performing this soft/intermediate anneal. According to an exemplary embodiment, in step 216 the workpiece is annealed at a temperature of from about 100° C. to about 300° C., e.g., at a temperature of about 155° C., while a linear pressure of from about 10 N/mm to about 700 N/mm is simultaneously applied to both sides (i.e., to a top and bottom) of the workpiece which, as provided above, also serves to control volume expansion and stresses on the layers of the cell. As will be described below, a final anneal will be performed in an S-containing environment to complete the CIGS absorber.

As will be described in detail below, in some exemplary embodiments, the heating and simultaneous application of pressure to the workpiece is performed in step 216 via another set of rollers that are in contact with opposing sides (i.e., one roller is in contact with the top and one roller is in contact with the bottom) of the workpiece such that as the workpiece is fed through the continuous line fabrication process, the workpiece passes between the set of rollers. The rollers can be heated to thereby heat the workpiece as the workpiece passes between the rollers. Thus, in this exemplary embodiment, the rollers at this stage of the continuous line process are configured to simultaneously 1) heat the workpiece and 2) apply pressure to both sides of the workpiece.

Next, in step 218 a S/Se layer is deposited onto the substrate material on top of the Ga layer. In order to control volume expansion and stresses on the layers of the cell, pressure is applied to both sides (i.e., to a top and bottom—to the substrate and S/Se layer, respectively) of the workpiece during this S/Se deposition step. Exemplary pressure values that may be employed during this metal deposition step were provided above.

As will be described in detail below, in some exemplary embodiments, the S/Se deposition and simultaneous application of pressure to the workpiece is performed via another set of rollers that are in contact with opposing sides (i.e., one roller is in contact with the top and one roller is in contact with the bottom) of the workpiece such that as the workpiece is fed through the continuous line fabrication process, the workpiece passes between the set of rollers. The rollers can be configured to deposit the S/Se onto the workpiece from a bath of molten S/Se through which one of the rollers passes. Namely, as the roller passes through the bath, some of the molten S/Se is picked up by the roller and transferred to the workpiece. Thus, in this exemplary embodiment, the rollers are configured to simultaneously 1) apply S/Se to the workpiece, 2) apply pressure to both sides of the workpiece.

The S/Se material deposited in step 218 will still be (at least to some extent) molten after it is transferred to the workpiece. Thus, in step 220 the workpiece is cooled. In order to control volume expansion and stresses on the layers of the cell, pressure is applied to both sides (i.e., to a top and bottom) of the workpiece during this cooling step. Exemplary temperature and pressure values for this stage of the process were provided above.

As will be described in detail below, in some exemplary embodiments, the cooling and simultaneous application of pressure to the workpiece is performed in step 220 via another set of rollers that are in contact with opposing sides (i.e., one roller is in contact with the top and one roller is in contact with the bottom) of the workpiece such that as the workpiece is fed through the continuous line fabrication process, the workpiece passes between the set of rollers. The rollers can be cooled to thereby cool the workpiece as the workpiece passes between the rollers. Thus, in this exemplary embodiment, the rollers at this stage of the continuous line process are configured to simultaneously 1) cool the workpiece and 2) apply pressure to both sides of the workpiece.

Finally, in step 222, the workpiece is subjected to a final anneal in a S environment. As with the heating steps described above, pressure is applied to the workpiece while the workpiece is heated during step 222. According to an exemplary embodiment, in step 222 the workpiece is annealed at a temperature of from about 500° C. to about 600° C., e.g., at a temperature of about 500° C., while a linear pressure of from about 10 N/mm to about 700 N/mm is simultaneously applied to both sides (i.e., to a top and bottom) of the workpiece which, as provided above, also serves to control volume expansion and stresses on the layers of the cell.

As will be described in detail below, in some exemplary embodiments, the heating and simultaneous application of pressure to the workpiece is performed in step 222 via another set of rollers that are in contact with opposing sides (i.e., one roller is in contact with the top and one roller is in contact with the bottom) of the workpiece such that as the workpiece is fed through the continuous line fabrication process, the workpiece passes between the set of rollers. The rollers can be heated to thereby heat the workpiece as the workpiece passes between the rollers. Thus, in this exemplary embodiment, the rollers at this stage of the continuous line process are configured to simultaneously 1) heat the workpiece and 2) apply pressure to both sides of the workpiece.

The CIGS absorber is now complete. Any further processing of the cell can be carried out using conventional techniques to form a buffer layer, top electrode, etc. to complete the solar cell.

It is notable that the above sequence of processing steps is merely exemplary, and depending on the desired final composition of the thin film solar cell the sequence of steps performed and/or the materials deposited at each of the stages may vary. Thus, the present process is configurable to a variety of different thin film configurations. What is notable here is that the present techniques provide means to apply pressure to both sides of the workpiece while simultaneously depositing a thin film material (and potentially also simultaneously heating or cooling the workpiece). The exact thin film material being deposited and/or the order in which the materials are deposited, heated/cooled, etc. can be varied yet still remain within the confines of the present techniques.

Further, as is apparent from the description above, in accordance with the present techniques, the materials may be deposited from an electrochemical solution (via an electrodeposition process) and/or from another chemical solution (e.g., via deposition from a molten bath, sputtering, etc.). The term "electrochemical solution" as used herein will generally refer to the solutions described herein for use in an electrodeposition process. All other solutions used for depositing the present materials onto the substrate (e.g., molten metal bath) will generally be referred to herein as "chemical solutions."

Figure 3B:
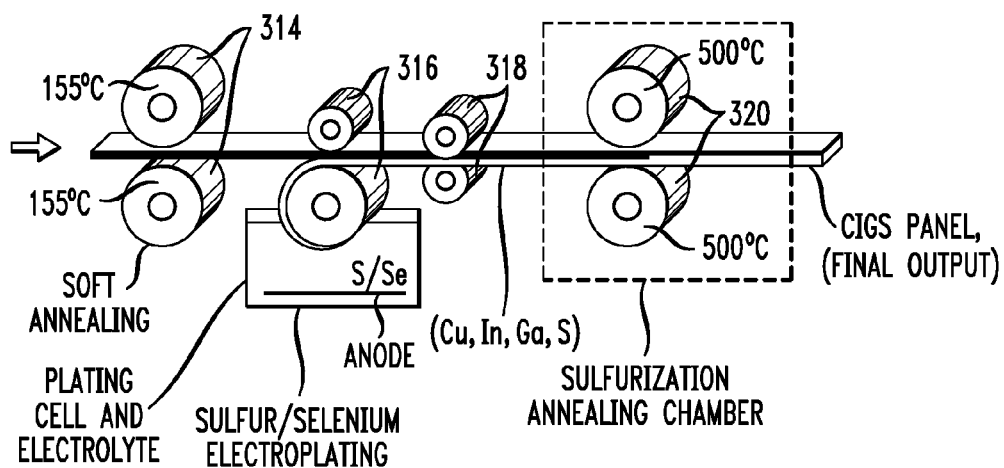

Exemplary embodiments implementing the present techniques for continuous-line fabrication of thin film solar cells are now described by way of reference to FIGS. 3-5. In FIGS. 3A-B a continuous line processing apparatus is depicted performing the method described in FIG. 1, above (i.e., wherein deposition of the various CIGS layers occurs via electrodeposition) on a Mo-coated glass substrate. It is to be understood that FIGS. 3A-B illustrate a single, continuous-line apparatus/process, however, for ease and clarity of depiction, the figure is broken into two parts (FIG. 3A and FIG. 3B).

As shown in FIG. 3A, a Mo-coated glass substrate is fed into the apparatus between a first set of rollers 302. As described in conjunction with the description of step 104 of FIG. 1, above, a Cu layer is deposited onto the substrate (i.e., onto the Mo layer of the Mo-coated substrate) while at the same time pressure is applied to both sides (i.e., to a top and bottom) of the workpiece in order to control volume expansion and stresses on the layers of the cell. In the embodiment shown in FIG. 3A, this Cu deposition and simultaneous application of pressure to the workpiece is performed via rollers 302 which as shown in FIG. 3A are in contact with opposing sides (i.e., one of rollers 302 is in contact with the top and one of rollers 302 is in contact with the bottom) of the workpiece such that as the workpiece is fed through the continuous line fabrication process, the workpiece passes between rollers 302. Further, as shown in FIG. 3A, the rollers 302 are configured to deposit the Cu onto the workpiece from a Cu-containing electrolyte solution through which one of the rollers 302 passes. Namely, according to an exemplary embodiment, rollers 302 are made of a metal such as stainless steel. As the bottom roller 302 passes through the Cu-containing electrolyte solution, the Cu is electrodeposited onto the roller from the electrolyte solution. In this example, there is an anode in the electrolyte solution and the bottom (e.g., metal) roller 302 acts as a cathode for the electrodeposition process. The Cu electrodeposited on the bottom roller 302 is then transferred (from the bottom roller 302) onto the workpiece. As described above, the transfer of the Cu from the bottom roller 302 to the workpiece can be facilitated by cooling the rollers 302. Namely, cooling the rollers will facilitate cladding the Cu to the workpiece, rather than to the (metal) roller itself. Further, due to this being a continuous line process, as the workpiece passes through each stage, the material already deposited and cladded onto the workpiece will aid in removing the material from the roller (similar to when any sort of material is unwound from a roll) and cooling the rollers facilitates removal of the material from the roll. Temperature and pressure parameters for this step were provided above. Thus, in this exemplary embodiment, the rollers 302 are configured to simultaneously 1) apply Cu to the workpiece and 2) apply pressure to both sides of the workpiece.

The pressure applied to the workpiece by the rollers 302 may be based on the weight of the top roller 302 pressing down on the workpiece against the bottom roller 302. Thus, as shown in FIG. 3A, the top roller 302 might have a size (wherein the size of a roller is determined based on its cross-sectional diameter) that equates with a certain weight of the top roller 302 to achieve a desired amount of pressure when the weight of the top roller 302 is applied to the workpiece against the bottom roller 302. Accordingly the top roller 302 and the bottom roller 302 are not shown to be the same size as one another.

As shown in FIG. 3A, a (e.g., nitrogen ($N_2$)) air knife present in the direction of rotation between the plating cell and the workpiece serves to direct plating solution from the roller 302 back into the Cu plating cell. A water jet may also be implemented in the line following the Cu deposition, to clean the workpiece, followed by an air drying step to remove the water.

As described in conjunction with the description of step 106 of FIG. 1, above, in order to bond the Cu deposited onto the substrate material, pressure and heat are applied to the workpiece in step 106. The pressure serves to control volume expansion and stresses on the layers of the cell. In the exemplary embodiments shown in FIG. 3A, this heating and simultaneous application of pressure to the workpiece is performed via rollers 304 that are in contact with opposing sides (i.e., one of the rollers 304 is in contact with the top and one of the rollers 304 is in contact with the bottom) of the workpiece such that as the workpiece is fed through the continuous line fabrication process, the workpiece passes between the rollers 304. The rollers 304 can be heated to thereby heat the workpiece as the workpiece passes between the rollers 304. Temperature and pressure parameters for this step were provided above. Thus, in this exemplary embodiment, the rollers 304 at this stage of the continuous line process are configured to simultaneously 1) heat the workpiece and 2) apply pressure to both sides of the workpiece.

As provided above, electrodeposition is only one exemplary process that may be employed herein for depositing the material onto the substrate. For instance, another suitable deposition process (such as sputtering) may be used to deposit the material onto the rollers, which then apply the material to the substrate in the manner described above. Alternatively, the material may be deposited directly onto the substrate with pressure and/or heat being supplied via the rollers as described above. These alternative embodiments are described in detail below.

As described in conjunction with the description of step 108 of FIG. 1, above, a In layer is deposited onto the substrate on top of the Cu layer while at the same time pressure is applied to both sides (i.e., to a top and bottom) of the workpiece in order to control volume expansion and stresses on the layers of the cell. In the embodiment shown in FIG. 3A, this In deposition and simultaneous application of pressure to the workpiece is performed via rollers 306 which as shown in FIG. 3A are in contact with opposing sides (i.e., one of rollers 306 is in contact with the top and one of rollers 306 is in contact with the bottom) of the workpiece such that as the workpiece is fed through the continuous line fabrication process, the workpiece passes between rollers 306. Further, as shown in FIG. 3A, the rollers 306 are configured to deposit the In onto the workpiece from an In-containing electrolyte solution through which one of the rollers 306 passes. Namely, as described above, the rollers 302 can be made of a metal such as stainless steel and as the bottom roller 306 passes through the In-containing electrolyte solution, the In is electrodeposited onto the roller from the electrolyte solution (i.e., the bottom roller 306 acts as a cathode for the electrodeposition process). The In electrodeposited on the bottom roller 306 is then transferred (from the bottom roller 306) onto the workpiece. As described above, the transfer of the In from the bottom roller 306 to the workpiece can be facilitated by cooling the rollers 306—to insure cladding of the In onto the workpiece rather than onto the rollers. Temperature and pressure parameters for this step were provided above. Thus, in this exemplary embodiment, the rollers 306 are configured to simultaneously 1) apply In to the workpiece and 2) apply pressure to both sides of the workpiece.

As described above, the pressure applied to the workpiece by the rollers 306 may be based on the weight of the top roller 306 pressing down on the workpiece against the bottom roller 306. Accordingly, as provided above, the rollers 306 may not be the same size as one another.

While not explicitly shown in FIG. 3A, a (e.g., nitrogen ($N_2$)) air knife may be present in the direction of rotation between the plating cell and the workpiece to direct plating solution from the rollers 306 back into the In plating cell. A water jet may also be implemented in the line following the In deposition, to clean the workpiece, followed by an air drying step to remove the water. The air knife, water jet and air drying would be implemented in the same manner as described above in conjunction with the Cu deposition electroplating stage.

As described in conjunction with the description of step 110 of FIG. 1, above, in order to bond the In deposited onto the substrate material, pressure and heat are applied to the workpiece. The pressure serves to control volume expansion and stresses on the layers of the cell. In the exemplary embodiments shown in FIG. 3A, this heating and simultaneous application of pressure to the workpiece is performed via rollers 308 that are in contact with opposing sides (i.e., one of the rollers 308 is in contact with the top and one of the rollers 308 is in contact with the bottom) of the workpiece such that as the workpiece is fed through the continuous line fabrication process, the workpiece passes between the rollers 308. The rollers 308 can be heated to thereby heat the workpiece as the workpiece passes between the rollers 308. Temperature and pressure parameters for this step were provided above. Thus, in this exemplary embodiment, the rollers 308 at this stage of the continuous line process are configured to simultaneously 1) heat the workpiece and 2) apply pressure to both sides of the workpiece.

Again, electrodeposition is only one exemplary process that may be employed herein for depositing the material onto the substrate. For instance, another suitable deposition process (such as sputtering) may be used to deposit the material onto the rollers, which then apply the material to the substrate in the manner described above. Alternatively, the material may be deposited directly onto the substrate with pressure and/or heat being supplied via the rollers as described above.

As described in conjunction with the description of step 112 of FIG. 1, above, a Ga layer is deposited onto the substrate on top of the In layer while at the same time pressure is applied to both sides (i.e., to a top and bottom) of the workpiece in order to control volume expansion and stresses on the layers of the cell. In the embodiment shown in FIG. 3A, this Ga deposition and simultaneous application of pressure to the workpiece is performed via rollers 310 which as shown in FIG. 3A are in contact with opposing sides (i.e., one of rollers 310 is in contact with the top and one of rollers 310 is in contact with the bottom) of the workpiece such that as the workpiece is fed through the continuous line fabrication process, the workpiece passes between rollers 310. Further, as shown in FIG. 3A, the rollers 310 are configured to deposit the Ga onto the workpiece from a Ga-containing electrolyte solution through which one of the rollers 310 passes. Namely, as described above, the rollers 310 can be made of a metal such as stainless steel and as the bottom roller 310 passes through the Ga-containing electrolyte solution, the Ga is electrodeposited onto the roller from the electrolyte solution (i.e., the bottom roller 310 acts as a cathode for the electrodeposition process). The Ga electrodeposited on the bottom roller 310 is then transferred (from the bottom roller 310) onto the workpiece. As described above, the transfer of the Ga from the bottom roller 310 to the workpiece can be facilitated by cooling the rollers 310—to insure cladding of the Ga onto the workpiece rather than onto the rollers. Temperature and pressure parameters for this step were provided above. Thus, in this exemplary embodiment, the rollers 310 are configured to simultaneously 1) apply Ga to the workpiece and 2) apply pressure to both sides of the workpiece.

As described above, the pressure applied to the workpiece by the rollers 310 may be based on the weight of the top roller 310 pressing down on the workpiece against the bottom roller 310. Accordingly, as provided above, the rollers 310 may not be the same size as one another.

While not explicitly shown in FIG. 3A, a (e.g., nitrogen ($N_2$)) air knife may be present in the direction of rotation between the plating cell and the workpiece to direct plating solution from the rollers 310 back into the Ga plating cell. A water jet may also be implemented in the line following the Ga deposition, to clean the workpiece, followed by an air drying step to remove the water. The air knife, water jet and air drying would be implemented in the same manner as described above in conjunction with the Cu deposition electroplating stage.

As described in conjunction with the description of step 114 of FIG. 1, above, in order to bond the Ga deposited onto the substrate material, pressure and heat are applied to the workpiece. The pressure serves to control volume expansion and stresses on the layers of the cell. In the exemplary embodiment shown in FIG. 3A, this heating and simultaneous application of pressure to the workpiece is performed via rollers 312 that are in contact with opposing sides (i.e., one of the rollers 312 is in contact with the top and one of the rollers 312 is in contact with the bottom) of the workpiece such that as the workpiece is fed through the continuous line fabrication process, the workpiece passes between the rollers 312. The rollers 312 can be heated to thereby heat the workpiece as the workpiece passes between the rollers 312. Temperature and pressure parameters for this step were provided above. Thus, in this exemplary embodiment, the rollers 312 at this stage of the continuous line process are configured to simultaneously 1) heat the workpiece and 2) apply pressure to both sides of the workpiece.

As described in conjunction with the description of step 116 of FIG. 1, above, following deposition of the Ga onto the workpiece an optional soft/intermediate anneal may be performed to enhance the uniformity of the final CIGS material. Temperature and pressure parameters for this step were provided above. As with the heating steps described above, pressure is applied to the workpiece while the workpiece is heated during this soft annealing step. In the exemplary embodiment shown in FIG. 3B, this heating and simultaneous application of pressure to the workpiece is performed via rollers 314 that are in contact with opposing sides (i.e., one of the rollers 314 is in contact with the top and one of the rollers 314 is in contact with the bottom) of the workpiece such that as the workpiece is fed through the continuous line fabrication process, the workpiece passes between the rollers 314. The rollers 314 can be heated to thereby heat the workpiece as the workpiece passes between the rollers 314. Temperature and pressure parameters for this step were provided above. Thus, in this exemplary embodiment, the rollers 314 at this stage of the continuous line process are configured to simultaneously 1) heat the workpiece and 2) apply pressure to both sides of the workpiece.

Again, electrodeposition is only one exemplary process that may be employed herein for depositing the material onto the substrate. For instance, another suitable deposition process (such as sputtering) may be used to deposit the material onto the rollers, which then apply the material to the substrate in the manner described above. Alternatively, the material may be deposited directly onto the substrate with pressure and/or heat being supplied via the rollers as described above.

As described in conjunction with the description of step 118 of FIG. 1, above, a S and/or Se layer is deposited onto the substrate on top of the Ga layer while at the same time pressure is applied to both sides (i.e., to a top and bottom) of the workpiece in order to control volume expansion and stresses on the layers of the cell. In the embodiment shown in FIG. 3B, this S/Se deposition and simultaneous application of pressure to the workpiece is performed via rollers 316 which as shown in FIG. 3B are in contact with opposing sides (i.e., one of rollers 316 is in contact with the top and one of rollers 316 is in contact with the bottom) of the workpiece such that as the workpiece is fed through the continuous line fabrication process, the workpiece passes between rollers 316. Further, as shown in FIG. 3B, the rollers 316 are configured to deposit the S/Se onto the workpiece from a S/Se-containing electrolyte solution through which one of the rollers 316 passes. Namely, as described above, the rollers 316 can be made of a metal such as stainless steel and as the bottom roller 316 passes through the S/Se-containing electrolyte solution, the S/Se is electrodeposited onto the roller from the electrolyte solution (i.e., the bottom roller 316 acts as a cathode for the electrodeposition process). The S/Se electrodeposited on the bottom roller 316 is then transferred (from the bottom roller 316) onto the workpiece. As described above, the transfer of the S/Se from the bottom roller 316 to the workpiece can be facilitated by cooling the rollers 316—to insure cladding of the S/Se onto the workpiece rather than onto the rollers. Temperature and pressure parameters for this step were provided above. Thus, in this exemplary embodiment, the rollers 316 are configured to simultaneously 1) apply S/Se to the workpiece and 2) apply pressure to both sides of the workpiece. As described above, the pressure applied to the workpiece by the rollers 316 may be based on the weight of the top roller 316 pressing down on the workpiece against the bottom roller 316. Accordingly, as provided above, the rollers 316 may not be the same size as one another.

While not explicitly shown in FIG. 3B, a (e.g., nitrogen ($N_2$)) air knife may be present in the direction of rotation between the plating cell and the workpiece to direct plating solution from the rollers 316 back into the S/Se plating cell. A water jet may also be implemented in the line following the S/Se deposition, to clean the workpiece, followed by an air drying step to remove the water. The air knife, water jet and air drying would be implemented in the same manner as described above in conjunction with the Cu deposition electroplating stage.

Again, electrodeposition is only one exemplary process that may be employed herein for depositing the material onto the substrate. For instance, another suitable deposition process (such as sputtering) may be used to deposit the material onto the rollers, which then apply the material to the substrate in the manner described above. Alternatively, the material may be deposited directly onto the substrate with pressure and/or heat being supplied via the rollers as described above.

As described in conjunction with the description of step 120 of FIG. 1, above, in order to bond the S/Se deposited onto the substrate material, pressure and heat are applied to the workpiece. The pressure serves to control volume expansion and stresses on the layers of the cell. In the exemplary embodiment shown in FIG. 3B, this heating and simultaneous application of pressure to the workpiece is performed via rollers 318 that are in contact with opposing sides (i.e., one of the rollers 318 is in contact with the top and one of the rollers 318 is in contact with the bottom) of the workpiece such that as the workpiece is fed through the continuous line fabrication process, the workpiece passes between the rollers 318. The rollers 318 can be heated to thereby heat the workpiece as the workpiece passes between the rollers 318. Temperature and pressure parameters for this step were provided above. Thus, in this exemplary embodiment, the rollers 318 at this stage of the continuous line process are configured to simultaneously 1) heat the workpiece and 2) apply pressure to both sides of the workpiece.

As described in conjunction with the description of step 122 of FIG. 1, above, following deposition of the S/Se onto the workpiece a final anneal is performed. Temperature and pressure parameters for this step were provided above. As with the heating steps described above, pressure is applied to the workpiece while the workpiece is heated during this final annealing step. In the exemplary embodiment shown in FIG. 3B, this heating and simultaneous application of pressure to the workpiece is performed via rollers 320 that are in contact with opposing sides (i.e., one of the roller 320 is in contact with the top and one of the roller 320 is in contact with the bottom) of the workpiece such that as the workpiece is fed through the continuous line fabrication process, the workpiece passes between the rollers 320. The rollers 320 can be heated to thereby heat the workpiece as the workpiece passes between the rollers 320. Thus, in this exemplary embodiment, the rollers 320 at this stage of the continuous line process are configured to simultaneously 1) heat the workpiece and 2) apply pressure to both sides of the workpiece.

As shown in FIG. 3B, this final anneal is conducted in a S environment. By way of example only, the workpiece may be fed (in a continuous line fashion) into a sulfurization annealing chamber. The final output is a CIGS panel.

It is notable that the thin film compositions described above, and elsewhere herein are merely examples intended to illustrate the present techniques, and a variety of other film compositions can be achieved in the manner described herein. One would need only to vary the composition of the materials deposited in one or more of the steps and/or the order in which the materials are deposited in order to achieve different thin film compositions. In addition to the CIGS example provided above, by way of example only, one may adapt the present techniques to produce any of the following thin film solar cell compositions: CZTS ($Cu_2ZnSn(Se,S)_4$), $FeS_2$, $Zn_2P_3$, CdSe, CdS, ZnSe, $WSe_2$, $MoSe_2$, $Bi_2S_3$, $Ag_2S$, $Cu_2Zn(Fe,Sn)(Se,S)_4$, CuxS, CdTe, ZnTe, PbSe, PdS, NiS, NiSeS, InP, ZnO, GaAs. An example involving a I-III-$IV_2$ material is provided below.

Figure 4A:
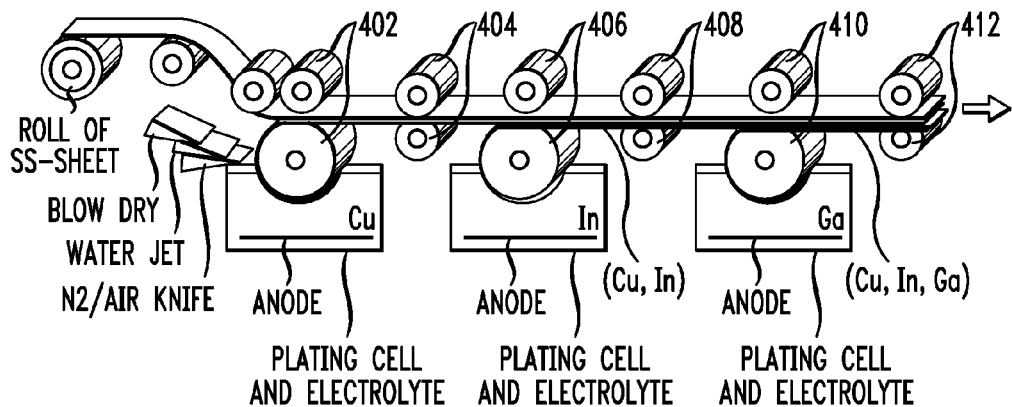
FIGS. 4A-B are diagrams illustrating another continuous line processing apparatus for fabricating thin film solar cells according to the method of FIG. 1 according to an embodiment of the present invention.
Figure 4B:
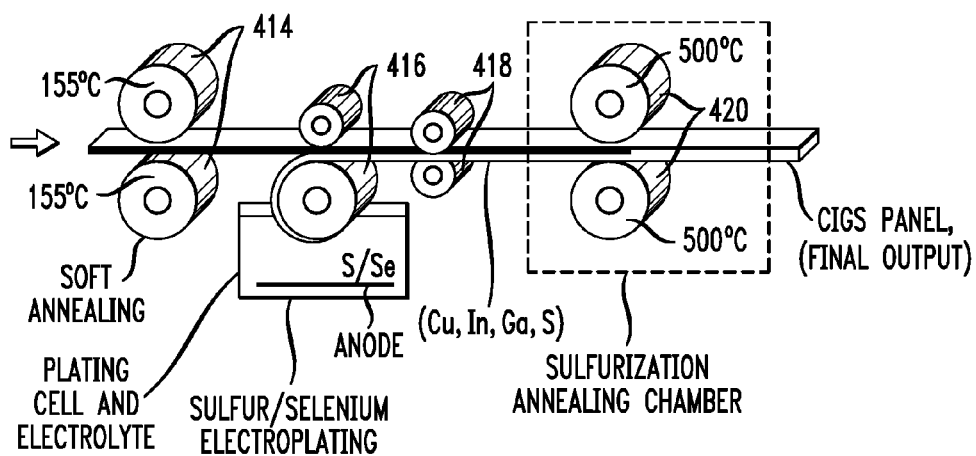

Another exemplary embodiment implementing the present techniques for continuous-line fabrication of thin film solar cells is now described by way of reference to FIGS. 4A-B. In FIGS. 4A-B a continuous line processing apparatus is depicted performing the method described in FIG. 1, above (i.e., wherein deposition of the various CIGS layers occurs via electrodeposition) on a metal (e.g., stainless steel (SS) sheet) substrate. It is to be understood that FIGS. 4A-B illustrate a single, continuous-line apparatus/process, however, for ease and clarity of depiction, the figure is broken into two parts (FIG. 4A and FIG. 4B).

As shown in FIG. 4A, a stainless steel substrate is fed into the apparatus between a first set of rollers 402. As compared to the glass substrate illustrated in FIGS. 3A-B, a stainless steel metal substrate is more flexible and can be fed through the continuous line apparatus/process from a roll (as shown in FIG. 4A—labeled "roll of SS-sheet"). Accordingly, additional rollers may be employed in the production line prior to rollers 402 in order to guide the substrate from the roll. The particular number and positioning of these 'guide' rollers will of course vary depending on the particular set-up at hand, and their use is optional.

As described in conjunction with the description of step 104 of FIG. 1, above, a Cu layer is deposited onto the substrate while at the same time pressure is applied to both sides (i.e., to a top and bottom) of the workpiece in order to control volume expansion and stresses on the layers of the cell. In the embodiment shown in FIG. 4A, this Cu deposition and simultaneous application of pressure to the workpiece is performed via rollers 402 which as shown in FIG. 4A are in contact with opposing sides (i.e., one of rollers 402 is in contact with the top and one of rollers 402 is in contact with the bottom) of the workpiece such that as the workpiece is fed through the continuous line fabrication process, the workpiece passes between rollers 402. Further, as shown in FIG. 4A, the rollers 402 are configured to deposit the Cu onto the workpiece from a Cu-containing electrolyte solution through which one of the rollers 402 passes. Namely, according to an exemplary embodiment, rollers 402 are made of a metal such as stainless steel. As the bottom roller 402 passes through the Cu-containing electrolyte solution, the Cu is electrodeposited onto the roller from the electrolyte solution. In this example, there is an anode in the electrolyte solution and the bottom (e.g., metal) roller 402 acts as a cathode for the electrodeposition process. The Cu electrodeposited on the bottom roller 402 is then transferred (from the bottom roller 402) onto the workpiece. As described above, the transfer of the Cu from the bottom roller 402 to the workpiece can be facilitated by cooling the rollers 402. Namely, cooling the rollers will facilitate cladding the Cu to the workpiece, rather than to the (metal) roller itself. Further, due to this being a continuous line process, as the workpiece passes through each stage, the material already deposited and cladded onto the workpiece will aid in removing the material from the roller (similar to when any sort of material is unwound from a roll) and cooling the rollers facilitates removal of the material from the roll. Thus, in this exemplary embodiment, the rollers 402 are configured to simultaneously 1) apply Cu to the workpiece and 2) apply pressure to both sides of the workpiece. As described above, the pressure applied to the workpiece by the rollers 402 may be based on the weight of the top roller 402 pressing down on the workpiece against the bottom roller 402, and accordingly the top roller 402 and the bottom roller 402 may not be the same size as one another.

As shown in FIG. 4A, a (e.g., nitrogen ($N_2$)) air knife present in the direction of rotation between the plating cell and the workpiece serves to direct plating solution from the rollers 402 back into the Cu plating cell. A water jet may also be implemented in the line following the Cu deposition, to clean the workpiece, followed by an air drying step to remove the water.

As described in conjunction with the description of step 106 of FIG. 1, above, in order to bond the Cu deposited onto the substrate material, pressure and heat are applied to the workpiece in step 106. The pressure serves to control volume expansion and stresses on the layers of the cell. In the exemplary embodiment shown in FIG. 4A, this heating and simultaneous application of pressure to the workpiece is performed via rollers 404 that are in contact with opposing sides (i.e., one of the roller 404 is in contact with the top and one of the roller 404 is in contact with the bottom) of the workpiece such that as the workpiece is fed through the continuous line fabrication process, the workpiece passes between the rollers 404. The rollers 404 can be heated to thereby heat the workpiece as the workpiece passes between the rollers 404. Temperature and pressure parameters for this step were provided above. Thus, in this exemplary embodiment, the rollers 404 at this stage of the continuous line process are configured to simultaneously 1) heat the workpiece and 2) apply pressure to both sides of the workpiece.

As provided above, electrodeposition is only one exemplary process that may be employed herein for depositing the material onto the substrate. For instance, another suitable deposition process (such as sputtering) may be used to deposit the material onto the rollers, which then apply the material to the substrate in the manner described above. Alternatively, the material may be deposited directly onto the substrate with pressure and/or heat being supplied via the rollers as described above.

As described in conjunction with the description of step 108 of FIG. 1, above, a In layer is deposited onto the substrate on top of the Cu layer while at the same time pressure is applied to both sides (i.e., to a top and bottom) of the workpiece in order to control volume expansion and stresses on the layers of the cell. In the embodiment shown in FIG. 4A, this In deposition and simultaneous application of pressure to the workpiece is performed via rollers 406 which as shown in FIG. 4A are in contact with opposing sides (i.e., one of rollers 406 is in contact with the top and one of rollers 406 is in contact with the bottom) of the workpiece such that as the workpiece is fed through the continuous line fabrication process, the workpiece passes between rollers 406. Further, as shown in FIG. 4A, the rollers 406 are configured to deposit the In onto the workpiece from an In-containing electrolyte solution through which one of the rollers 406 passes. Namely, as described above, the rollers 402 can be made of a metal such as stainless steel and as the bottom roller 406 passes through the In-containing electrolyte solution, the In is electrodeposited onto the roller from the electrolyte solution (i.e., the bottom roller 406 acts as a cathode for the electrodeposition process). The In electrodeposited on the bottom roller 406 is then transferred (from the bottom roller 406) onto the workpiece. As described above, the transfer of the In from the bottom roller 406 to the workpiece can be facilitated by cooling the rollers 406—to insure cladding of the In onto the workpiece rather than onto the rollers. Temperature and pressure parameters for this step were provided above. Thus, in this exemplary embodiment, the rollers 406 are configured to simultaneously 1) apply Cu to the workpiece and 2) apply pressure to both sides of the workpiece.

As described above, the pressure applied to the workpiece by the rollers 406 may be based on the weight of the top roller 406 pressing down on the workpiece against the bottom roller 406. Accordingly, as provided above, the rollers 406 may not be the same size as one another.

While not explicitly shown in FIG. 4A, a (e.g., nitrogen ($N_2$)) air knife may be present in the direction of rotation between the plating cell and the workpiece to direct plating solution from the rollers 406 back into the In plating cell. A water jet may also be implemented in the line following the In deposition, to clean the workpiece, followed by an air drying step to remove the water. The air knife, water jet and air drying would be implemented in the same manner as described above in conjunction with the Cu deposition electroplating stage.

Again, electrodeposition is only one exemplary process that may be employed herein for depositing the material onto the substrate. For instance, another suitable deposition process (such as sputtering) may be used to deposit the material onto the rollers, which then apply the material to the substrate in the manner described above. Alternatively, the material may be deposited directly onto the substrate with pressure and/or heat being supplied via the rollers as described above.

As described in conjunction with the description of step 110 of FIG. 1, above, in order to bond the In deposited onto the substrate material, pressure and heat are applied to the workpiece. The pressure serves to control volume expansion and stresses on the layers of the cell. In the exemplary embodiments shown in FIG. 4A, this heating and simultaneous application of pressure to the workpiece is performed via rollers 408 that are in contact with opposing sides (i.e., one of the rollers 408 is in contact with the top and one of the rollers 408 is in contact with the bottom) of the workpiece such that as the workpiece is fed through the continuous line fabrication process, the workpiece passes between the rollers 408. The rollers 408 can be heated to thereby heat the workpiece as the workpiece passes between the rollers 408. Temperature and pressure parameters for this step were provided above. Thus, in this exemplary embodiment, the rollers 408 at this stage of the continuous line process are configured to simultaneously 1) heat the workpiece and 2) apply pressure to both sides of the workpiece.

As described in conjunction with the description of step 112 of FIG. 1, above, a Ga layer is deposited onto the substrate on top of the In layer while at the same time pressure is applied to both sides (i.e., to a top and bottom) of the workpiece in order to control volume expansion and stresses on the layers of the cell. In the embodiment shown in FIG. 4A, this Ga deposition and simultaneous application of pressure to the workpiece is performed via rollers 410 which as shown in FIG. 4A are in contact with opposing sides (i.e., one of rollers 410 is in contact with the top and one of rollers 410 is in contact with the bottom) of the workpiece such that as the workpiece is fed through the continuous line fabrication process, the workpiece passes between rollers 410. Further, as shown in FIG. 4A, the rollers 410 are configured to deposit the Ga onto the workpiece from a Ga-containing electrolyte solution through which one of the rollers 410 passes. Namely, as described above, the rollers 410 can be made of a metal such as stainless steel and as the bottom roller 410 passes through the Ga-containing electrolyte solution, the Ga is electrodeposited onto the roller from the electrolyte solution (i.e., the bottom roller 410 acts as a cathode for the electrodeposition process). The Ga electrodeposited on the bottom roller 410 is then transferred (from the bottom roller 410) onto the workpiece. As described above, the transfer of the Ga from the bottom roller 410 to the workpiece can be facilitated by cooling the rollers 410—to insure cladding of the Ga onto the workpiece rather than onto the rollers. Temperature and pressure parameters for this step were provided above. Thus, in this exemplary embodiment, the rollers 410 are configured to simultaneously 1) apply Ga to the workpiece and 2) apply pressure to both sides of the workpiece.

As described above, the pressure applied to the workpiece by the rollers 410 may be based on the weight of the top roller 410 pressing down on the workpiece against the bottom roller 410. Accordingly, as provided above, the rollers 410 may not be the same size as one another.

While not explicitly shown in FIG. 4A, a (e.g., nitrogen ($N_2$)) air knife may be present in the direction of rotation between the plating cell and the workpiece to direct plating solution from the rollers 410 back into the Ga plating cell. A water jet may also be implemented in the line following the Ga deposition, to clean the workpiece, followed by an air drying step to remove the water. The air knife, water jet and air drying would be implemented in the same manner as described above in conjunction with the Cu deposition electroplating stage.

Again, electrodeposition is only one exemplary process that may be employed herein for depositing the material onto the substrate. For instance, another suitable deposition process (such as sputtering) may be used to deposit the material onto the rollers, which then apply the material to the substrate in the manner described above. Alternatively, the material may be deposited directly onto the substrate with pressure and/or heat being supplied via the rollers as described above.

As described in conjunction with the description of step 114 of FIG. 1, above, in order to bond the Ga deposited onto the substrate material, pressure and heat are applied to the workpiece. The pressure serves to control volume expansion and stresses on the layers of the cell. In the exemplary embodiment shown in FIG. 4A, this heating and simultaneous application of pressure to the workpiece is performed via rollers 412 that are in contact with opposing sides (i.e., one of the rollers 412 is in contact with the top and one of the rollers 412 is in contact with the bottom) of the workpiece such that as the workpiece is fed through the continuous line fabrication process, the workpiece passes between the rollers 412. The rollers 412 can be heated to thereby heat the workpiece as the workpiece passes between the rollers 412. Temperature and pressure parameters for this step were provided above. Thus, in this exemplary embodiment, the rollers 412 at this stage of the continuous line process are configured to simultaneously 1) heat the workpiece and 2) apply pressure to both sides of the workpiece.

As described in conjunction with the description of step 116 of FIG. 1, above, following deposition of the Ga onto the workpiece an optional soft/intermediate anneal may be performed to enhance the uniformity of the final CIGS material. Temperature and pressure parameters for this step were provided above. As with the heating steps described above, pressure is applied to the workpiece while the workpiece is heated during this soft annealing step. In the exemplary embodiment shown in FIG. 4B, this heating and simultaneous application of pressure to the workpiece is performed via rollers 414 that are in contact with opposing sides (i.e., one of the rollers 414 is in contact with the top and one of the rollers 414 is in contact with the bottom) of the workpiece such that as the workpiece is fed through the continuous line fabrication process, the workpiece passes between the rollers 414. The rollers 414 can be heated to thereby heat the workpiece as the workpiece passes between the rollers 414. Temperature and pressure parameters for this step were provided above. Thus, in this exemplary embodiment, the rollers 414 at this stage of the continuous line process are configured to simultaneously 1) heat the workpiece and 2) apply pressure to both sides of the workpiece.

As described in conjunction with the description of step 118 of FIG. 1, above, a S and/or Se layer is deposited onto the substrate on top of the Ga layer while at the same time pressure is applied to both sides (i.e., to a top and bottom) of the workpiece in order to control volume expansion and stresses on the layers of the cell. In the embodiment shown in FIG. 4B, this S/Se deposition and simultaneous application of pressure to the workpiece is performed via rollers 416 which as shown in FIG. 4B are in contact with opposing sides (i.e., one of rollers 416 is in contact with the top and one of rollers 416 is in contact with the bottom) of the workpiece such that as the workpiece is fed through the continuous line fabrication process, the workpiece passes between rollers 416. Further, as shown in FIG. 4B, the rollers 416 are configured to deposit the S/Se onto the workpiece from a S/Se-containing electrolyte solution through which one of the rollers 416 passes. Namely, as described above, the rollers 416 can be made of a metal such as stainless steel and as the bottom roller 416 passes through the S/Se-containing electrolyte solution, the S/Se is electrodeposited onto the roller from the electrolyte solution (i.e., the bottom roller 316 acts as a cathode for the electrodeposition process). The S/Se electrodeposited on the bottom roller 416 is then transferred (from the bottom roller 416) onto the workpiece. As described above, the transfer of the S/Se from the bottom roller 416 to the workpiece can be facilitated by cooling the rollers 416—to insure cladding of the S/Se onto the workpiece rather than onto the rollers. Temperature and pressure parameters for this step were provided above. Thus, in this exemplary embodiment, the rollers 416 are configured to simultaneously 1) apply S/Se to the workpiece and 2) apply pressure to both sides of the workpiece.

As described above, the pressure applied to the workpiece by the rollers 416 may be based on the weight of the top roller 416 pressing down on the workpiece against the bottom roller 416. Accordingly, as provided above, the rollers 416 may not be the same size as one another.

While not explicitly shown in FIG. 4B, a (e.g., nitrogen ($N_2$)) air knife may be present in the direction of rotation between the plating cell and the workpiece to direct plating solution from the rollers 416 back into the S/Se plating cell. A water jet may also be implemented in the line following the S/Se deposition, to clean the workpiece, followed by an air drying step to remove the water. The air knife, water jet and air drying would be implemented in the same manner as described above in conjunction with the Cu deposition electroplating stage.

Again, electrodeposition is only one exemplary process that may be employed herein for depositing the material onto the substrate. For instance, another suitable deposition process (such as sputtering) may be used to deposit the material onto the rollers, which then apply the material to the substrate in the manner described above. Alternatively, the material may be deposited directly onto the substrate with pressure and/or heat being supplied via the rollers as described above.

As described in conjunction with the description of step 120 of FIG. 1, above, in order to bond the S/Se deposited onto the substrate material, pressure and heat are applied to the workpiece. The pressure serves to control volume expansion and stresses on the layers of the cell. In the exemplary embodiment shown in FIG. 4B, this heating and simultaneous application of pressure to the workpiece is performed via rollers 418 that are in contact with opposing sides (i.e., one of the rollers 418 is in contact with the top and one of the rollers 418 is in contact with the bottom) of the workpiece such that as the workpiece is fed through the continuous line fabrication process, the workpiece passes between the rollers 418. The rollers 418 can be heated to thereby heat the workpiece as the workpiece passes between the rollers 418. Temperature and pressure parameters for this step were provided above. Thus, in this exemplary embodiment, the rollers 418 at this stage of the continuous line process are configured to simultaneously 1) heat the workpiece and 2) apply pressure to both sides of the workpiece.

As described in conjunction with the description of step 122 of FIG. 1, above, following deposition of the S/Se onto the workpiece final anneal is performed. Temperature and pressure parameters for this step were provided above. As with the heating steps described above, pressure is applied to the workpiece while the workpiece is heated during this final annealing step. In the exemplary embodiment shown in FIG. 4B, this heating and simultaneous application of pressure to the workpiece is performed via rollers 420 that are in contact with opposing sides (i.e., one of the rollers 420 is in contact with the top and one of the rollers 420 is in contact with the bottom) of the workpiece such that as the workpiece is fed through the continuous line fabrication process, the workpiece passes between the rollers 420. The rollers 420 can be heated to thereby heat the workpiece as the workpiece passes between the rollers 420. Thus, in this exemplary embodiment, the rollers 420 at this stage of the continuous line process are configured to simultaneously 1) heat the workpiece and 2) apply pressure to both sides of the workpiece.

As shown in FIG. 4B, this final anneal is conducted in a S/Se environment. By way of example only, the workpiece may be fed (in a continuous line fashion) into a sulfurization annealing chamber. The final output is a CIGS panel.

Figure 5A:
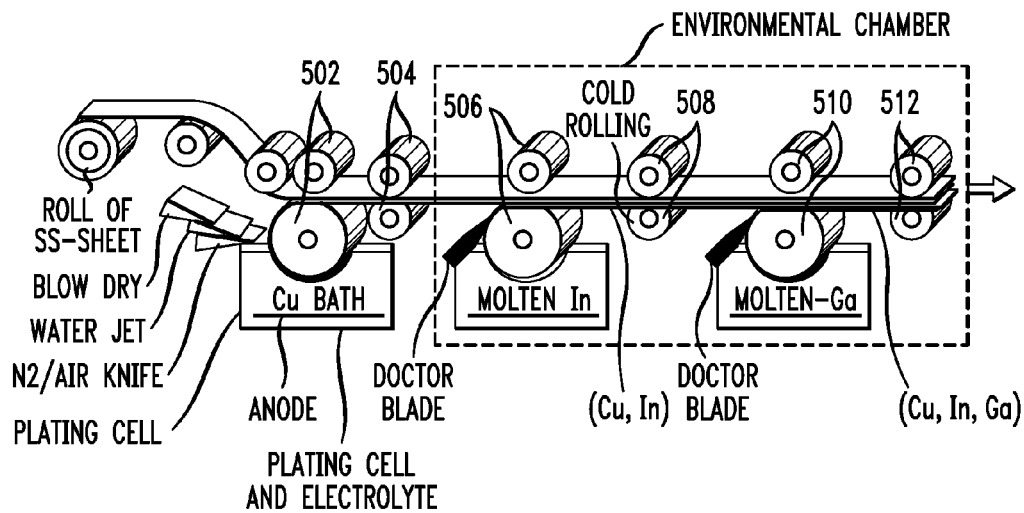
FIGS. 5A-B are diagrams illustrating a continuous line processing apparatus for fabricating thin film solar cells according to the method of FIG. 2 according to an embodiment of the present invention.
Figure 5B:
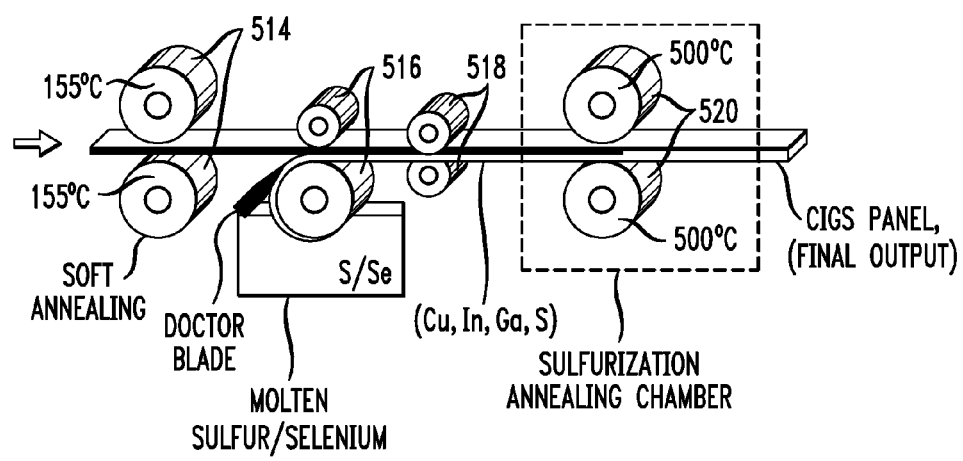

Yet another exemplary embodiment implementing the present techniques for continuous-line fabrication of thin film solar cells is now described by way of reference to FIGS. 5A-B. In FIGS. 5A-B a continuous line processing apparatus is depicted performing the method described in FIG. 2, above (i.e., wherein deposition of the various CIGS layers occurs via electrodeposition and/or via deposition from a molten bath) on a metal (e.g., stainless steel (SS) sheet) substrate. It is to be understood that FIGS. 5A-B illustrate a single, continuous-line apparatus/process, however, for ease and clarity of depiction, the figure is broken into two parts (FIG. 5A and FIG. 5B). By contrast with the embodiments shown illustrated in FIGS. 3A-B and 4A-B, in FIGS. 5A-B some of the CIGS layers are deposited onto the workpiece from a molten bath rather than via an electroplating cell.

As shown in FIG. 5A, a stainless steel substrate is fed into the apparatus between a first set of rollers 502. As compared to the glass substrate illustrated in FIGS. 3A-B, a stainless steel metal substrate is more flexible and can be fed through the continuous line apparatus/process from a roll (as shown in FIG. 5A—labeled "roll of SS-sheet"). Accordingly, additional rollers may be employed in the production line prior to rollers 502 in order to guide the substrate from the roll. The particular number and positioning of these 'guide' rollers will of course vary depending on the particular set-up at hand, and their use is optional.

As described in conjunction with the description of step 204 of FIG. 2, above, a Cu layer is deposited onto the substrate while at the same time pressure is applied to both sides (i.e., to a top and bottom) of the workpiece in order to control volume expansion and stresses on the layers of the cell. In the embodiment shown in FIG. 5A, this Cu deposition and simultaneous application of pressure to the workpiece is performed via rollers 502 which as shown in FIG. 5A are in contact with opposing sides (i.e., one of rollers 502 is in contact with the top and one of rollers 502 is in contact with the bottom) of the workpiece such that as the workpiece is fed through the continuous line fabrication process, the workpiece passes between rollers 502. Further, as shown in FIG. 5A, the rollers 502 are configured to deposit the Cu onto the workpiece from a Cu-containing electrolyte solution through which one of the rollers 502 passes. Namely, according to an exemplary embodiment, rollers 502 are made of a metal such as stainless steel. As the bottom roller 502 passes through the Cu-containing electrolyte solution, the Cu is electrodeposited onto the roller from the electrolyte solution. In this example, there is an anode in the electrolyte solution and the bottom (e.g., metal) roller 502 acts as a cathode for the electrodeposition process. The Cu electrodeposited on the bottom roller 502 is then transferred (from the bottom roller 502) onto the workpiece. As described above, the transfer of the Cu from the bottom roller 502 to the workpiece can be facilitated by cooling the rollers 502. Namely, cooling the rollers will facilitate cladding the Cu to the workpiece, rather than to the (metal) roller itself. Further, due to this being a continuous line process, as the workpiece passes through each stage, the material already deposited and cladded onto the workpiece will aid in removing the material from the roller (similar to when any sort of material is unwound from a roll) and cooling the rollers facilitates removal of the material from the roll. Temperature and pressure parameters for this step were provided above. Thus, in this exemplary embodiment, the rollers 502 are configured to simultaneously 1) apply Cu to the workpiece and 2) apply pressure to both sides of the workpiece. As described above, the pressure applied to the workpiece by the rollers 502 may be based on the weight of the top roller 502 pressing down on the workpiece against the bottom roller 502, and accordingly the top roller 502 and the bottom roller 502 may not be the same size as one another.

As shown in FIG. 5A, a (e.g., nitrogen ($N_2$)) air knife present in the direction of rotation between the plating cell and the workpiece serves to direct plating solution from the rollers 502 back into the Cu plating cell. A water jet may also be implemented in the line following the Cu deposition, to clean the workpiece, followed by an air drying step to remove the water.

As provided above, electrodeposition is only one exemplary process that may be employed herein for depositing the material onto the substrate. For instance, another suitable deposition process (such as sputtering) may be used to deposit the material onto the rollers, which then apply the material to the substrate in the manner described above. Alternatively, the material may be deposited directly onto the substrate with pressure and/or heat being supplied via the rollers as described above.

As described in conjunction with the description of step 206 of FIG. 2, above, in order to bond the Cu deposited onto the substrate material, pressure and heat are applied to the workpiece in step 206. The pressure serves to control volume expansion and stresses on the layers of the cell. In the exemplary embodiment shown in FIG. 5A, this heating and simultaneous application of pressure to the workpiece is performed via rollers 504 that are in contact with opposing sides (i.e., one of the roller 504 is in contact with the top and one of the roller 504 is in contact with the bottom) of the workpiece such that as the workpiece is fed through the continuous line fabrication process, the workpiece passes between the rollers 504. The rollers 504 can be heated to thereby heat the workpiece as the workpiece passes between the rollers 504. Temperature and pressure parameters for this step were provided above. Thus, in this exemplary embodiment, the rollers 504 at this stage of the continuous line process are configured to simultaneously 1) heat the workpiece and 2) apply pressure to both sides of the workpiece.

As described in conjunction with the description of step 208 of FIG. 2, above, a In layer is deposited onto the substrate on top of the Cu layer while at the same time pressure is applied to both sides (i.e., to a top and bottom) of the workpiece in order to control volume expansion and stresses on the layers of the cell. In the embodiment shown in FIG. 5A, this In deposition and simultaneous application of pressure to the workpiece is performed via rollers 506 which as shown in FIG. 5A are in contact with opposing sides (i.e., one of rollers 506 is in contact with the top and one of rollers 506 is in contact with the bottom) of the workpiece such that as the workpiece is fed through the continuous line fabrication process, the workpiece passes between rollers 506. Further, as shown in FIG. 5A, the rollers 506 are configured to deposit the In onto the workpiece from a bath of molten In through which one of the rollers 506 passes. Namely, as the bottom roller 506 passes through the bath, some of the molten In is picked up by the roller and transferred to the workpiece. As described above, the transfer of the In from the bottom roller 506 to the workpiece can be facilitated by cooling the rollers 506. Temperature and pressure parameters for this step were provided above. Thus, in this exemplary embodiment, the rollers 506 are configured to simultaneously 1) apply In to the workpiece and 2) apply pressure to both sides of the workpiece.

As described above, the pressure applied to the workpiece by the rollers 506 may be based on the weight of the top roller 506 pressing down on the workpiece against the bottom roller 506. Accordingly, as provided above, the rollers 506 may not be the same size as one another. As shown in FIG. 5A, a doctor blade may be present in the direction of rotation between the molten In bath and the workpiece to direct molten In from the rollers 506 back into the molten In bath.

As described in conjunction with the description of step 210 of FIG. 2, above, the In material deposited on the workpiece from the molten bath will still be (at least to some extent) molten after it is transferred to the workpiece. Thus, the workpiece is cooled. In order to control volume expansion and stresses on the layers of the cell, pressure is applied to both sides (i.e., to a top and bottom) of the workpiece during this cooling step. In the exemplary embodiment shown in FIG. 5A, this cooling and simultaneous application of pressure to the workpiece is performed via rollers 508 that are in contact with opposing sides (i.e., one of the rollers 508 is in contact with the top and one of the rollers 508 is in contact with the bottom) of the workpiece such that as the workpiece is fed through the continuous line fabrication process, the workpiece passes between the rollers 508. The rollers 508 can be cooled to thereby cool the workpiece as the workpiece passes between the rollers 508. Temperature and pressure parameters for this step were provided above. Thus, in this exemplary embodiment, the rollers 508 at this stage of the continuous line process are configured to simultaneously 1) cool the workpiece and 2) apply pressure to both sides of the workpiece.

As described in conjunction with the description of step 212 of FIG. 2, above, a Ga layer is deposited onto the substrate on top of the In layer while at the same time pressure is applied to both sides (i.e., to a top and bottom) of the workpiece in order to control volume expansion and stresses on the layers of the cell. In the embodiment shown in FIG. 5A, this Ga deposition and simultaneous application of pressure to the workpiece is performed via rollers 510 which as shown in FIG. 5A are in contact with opposing sides (i.e., one of rollers 510 is in contact with the top and one of rollers 510 is in contact with the bottom) of the workpiece such that as the workpiece is fed through the continuous line fabrication process, the workpiece passes between rollers 510. Further, as shown in FIG. 5A, the rollers 510 are configured to deposit the Ga onto the workpiece from a bath of molten Ga through which one of the rollers 510 passes. Namely, as the bottom roller 510 passes through the bath, some of the molten Ga is picked up by the roller and transferred to the workpiece. As described above, the transfer of the Ga from the bottom roller 510 to the workpiece can be facilitated by cooling the rollers 510—to insure cladding of the Ga onto the workpiece rather than onto the rollers. Temperature and pressure parameters for this step were provided above. Thus, in this exemplary embodiment, the rollers 510 are configured to simultaneously 1) apply Ga to the workpiece and 2) apply pressure to both sides of the workpiece.

As described above, the pressure applied to the workpiece by the rollers 510 may be based on the weight of the top roller 510 pressing down on the workpiece against the bottom roller 510. Accordingly, as provided above, the rollers 510 may not be the same size as one another. As shown in FIG. 5A, a doctor blade may be present in the direction of rotation between the molten Ga bath and the workpiece to direct molten Ga from the rollers 510 back into the molten Ga bath.

As described in conjunction with the description of step 214 of FIG. 2, above, the Ga material deposited on the workpiece from the molten bath will still be (at least to some extent) molten after it is transferred to the workpiece. Thus, the workpiece is cooled. In order to control volume expansion and stresses on the layers of the cell, pressure is applied to both sides (i.e., to a top and bottom) of the workpiece during this cooling step. In the exemplary embodiment shown in FIG. 5A, this cooling and simultaneous application of pressure to the workpiece is performed via rollers 512 that are in contact with opposing sides (i.e., one of the rollers 512 is in contact with the top and one of the rollers 512 is in contact with the bottom) of the workpiece such that as the workpiece is fed through the continuous line fabrication process, the workpiece passes between the rollers 512. The rollers 512 can be cooled to thereby cool the workpiece as the workpiece passes between the rollers 512. Temperature and pressure parameters for this step were provided above. Thus, in this exemplary embodiment, the rollers 512 at this stage of the continuous line process are configured to simultaneously 1) cool the workpiece and 2) apply pressure to both sides of the workpiece.

As described in conjunction with the description of step 216 of FIG. 2, above, following deposition of the Ga onto the workpiece an optional soft/intermediate anneal may be performed to enhance the uniformity of the final CIGS material. Temperature and pressure parameters for this step were provided above. As with the heating steps described above, pressure is applied to the workpiece while the workpiece is heated during this soft annealing step. In the exemplary embodiment shown in FIG. 5B, this heating and simultaneous application of pressure to the workpiece is performed via rollers 514 that are in contact with opposing sides (i.e., one of the rollers 514 is in contact with the top and one of the rollers 514 is in contact with the bottom) of the workpiece such that as the workpiece is fed through the continuous line fabrication process, the workpiece passes between the rollers 514. The rollers 514 can be heated to thereby heat the workpiece as the workpiece passes between the rollers 514. Temperature and pressure parameters for this step were provided above. Thus, in this exemplary embodiment, the rollers 514 at this stage of the continuous line process are configured to simultaneously 1) heat the workpiece and 2) apply pressure to both sides of the workpiece.

As described in conjunction with the description of step 218 of FIG. 2, above, a S and/or Se layer is deposited onto the substrate on top of the Ga layer while at the same time pressure is applied to both sides (i.e., to a top and bottom) of the workpiece in order to control volume expansion and stresses on the layers of the cell. In the embodiment shown in FIG. 5B, this S/Se deposition and simultaneous application of pressure to the workpiece is performed via rollers 516 which as shown in FIG. 5B are in contact with opposing sides (i.e., one of rollers 516 is in contact with the top and one of rollers 516 is in contact with the bottom) of the workpiece such that as the workpiece is fed through the continuous line fabrication process, the workpiece passes between rollers 516. Further, as shown in FIG. 5B, the rollers 516 are configured to deposit the S/Se onto the workpiece from a bath of molten S/Se through which one of the rollers 516 passes. Namely, as the bottom roller 516 passes through the bath, some of the molten S/Se is picked up by the roller and transferred to the workpiece. As described above, the transfer of the S/Se from the bottom roller 516 to the workpiece can be facilitated by cooling the rollers 516—to insure cladding of the S onto the workpiece rather than onto the rollers. Temperature and pressure parameters for this step were provided above. Thus, in this exemplary embodiment, the rollers 516 are configured to simultaneously 1) apply S/Se to the workpiece and 2) apply pressure to both sides of the workpiece.

As described above, the pressure applied to the workpiece by the rollers 516 may be based on the weight of the top roller 516 pressing down on the workpiece against the bottom roller 516. Accordingly, as provided above, the rollers 516 may not be the same size as one another. As shown in FIG. 5B, a doctor blade may be present in the direction of rotation between the molten S/Se bath and the workpiece to direct molten S/Se from the rollers 516 back into the molten S/Se bath.

As described in conjunction with the description of step 220 of FIG. 2, above, the S/Se material deposited on the workpiece from the molten bath will still be (at least to some extent) molten after it is transferred to the workpiece. Thus, the workpiece is cooled. In order to control volume expansion and stresses on the layers of the cell, pressure is applied to both sides (i.e., to a top and bottom) of the workpiece during this cooling step. In the exemplary embodiment shown in FIG. 5B, this cooling and simultaneous application of pressure to the workpiece is performed via rollers 518 that are in contact with opposing sides (i.e., one of the rollers 518 is in contact with the top and one of the rollers 518 is in contact with the bottom) of the workpiece such that as the workpiece is fed through the continuous line fabrication process, the workpiece passes between the rollers 518. The rollers 518 can be cooled to thereby cool the workpiece as the workpiece passes between the rollers 518. Temperature and pressure parameters for this step were provided above. Thus, in this exemplary embodiment, the rollers 518 at this stage of the continuous line process are configured to simultaneously 1) cool the workpiece and 2) apply pressure to both sides of the workpiece.

As described in conjunction with the description of step 222 of FIG. 2, above, following deposition of the S/Se onto the workpiece final anneal is performed. Temperature and pressure parameters for this step were provided above. As with the heating steps described above, pressure is applied to the workpiece while the workpiece is heated during this final annealing step. In the exemplary embodiment shown in FIG. 5B, this heating and simultaneous application of pressure to the workpiece is performed via rollers 520 that are in contact with opposing sides (i.e., one of the rollers 520 is in contact with the top and one of the rollers 520 is in contact with the bottom) of the workpiece such that as the workpiece is fed through the continuous line fabrication process, the workpiece passes between the rollers 520. The rollers 520 can be heated to thereby heat the workpiece as the workpiece passes between the rollers 520. Thus, in this exemplary embodiment, the rollers 520 at this stage of the continuous line process are configured to simultaneously 1) heat the workpiece and 2) apply pressure to both sides of the workpiece.

As shown in FIG. 5B, this final anneal is conducted in a S environment. By way of example only, the workpiece may be fed (in a continuous line fashion) into a sulfurization annealing chamber. The final output is a CIGS panel.

Figure 6:
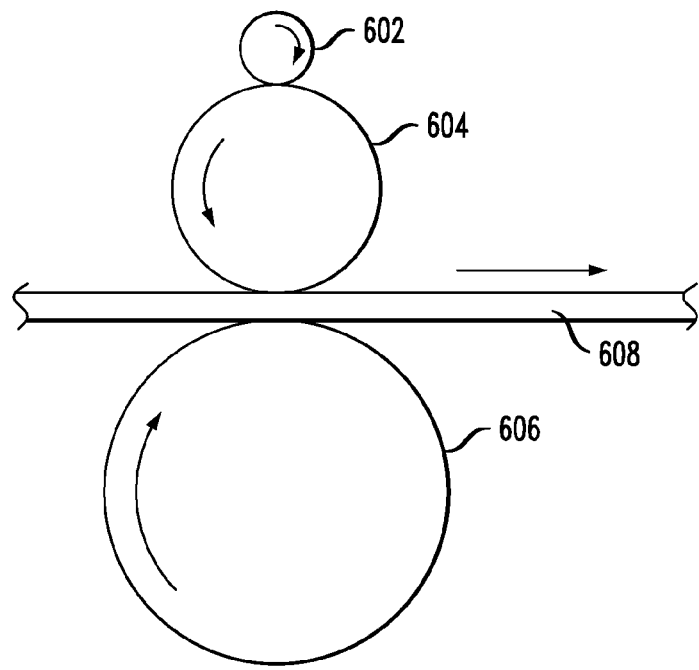
FIG. 6 is an exemplary drive system that may be employed with any of the continuous-line apparatuses presented herein according to an embodiment of the present invention.

FIG. 6 is an exemplary drive system for turning the rollers and thereby advancing the workpiece throughout the present continuous-line processing apparatus. As provided above, this drive system may be implemented in any of the apparatus embodiments shown and described above. As shown in FIG. 6, the drive system includes a first roller 602 that is motor-driven. For illustrative purposes, the first roller 602 is shown to be turning in a clockwise direction. The first roller 602 is in physical contact with one (i.e., roller 604) of a set of rollers. By turning in a clockwise direction, the roller 602 turns the roller 604 in a counterclockwise direction. Both of the sets of rollers 604 and 606 are in physical contact with the workpiece 608. In having the roller 604 turn in a counterclockwise direction, the workpiece 608 is advanced (from left to right in the depiction shown). Movement of the workpiece turns the roller 606 in a clockwise direction. As provided above, the sets of rollers (in this case roller 604 and roller 606, also serve to apply pressure to the workpiece, heat/cool the workpiece, and apply film material to the workpiece. The function of applying pressure (also termed "roll-to-roll pressure—since the pressure is being applied by the two rollers between which the workpiece passes) is now described.

According to one exemplary embodiment, the rollers are constructed of metal and the pressure applied to the workpiece is supplied based on the weight of the roller on the workpiece. For instance, in the example shown in FIG. 6, the top roller 604 can be configured to have a weight such that the force of roller 604 on the workpiece against roller 606 provides the specified amount of pressure (see above) on the workpiece. Accordingly, the size (i.e., diameter) of the top roller can be configured such that the roller has a certain weight and thus applies the desired amount of pressure to the workpiece. This is illustrated in FIG. 6 where the size (i.e., diameter) of roller 604 is less than that of roller 606.

It is notable that while the drive system shown in FIG. 6 may be fitted to each set of rollers in the apparatus, this might not be necessary as driving (e.g., only one or two sets of rollers) may be sufficient to feed the workpiece through the apparatus. According to an exemplary embodiment, only the first set of rollers in the apparatus is powered (motor-driven).

Figure 7:
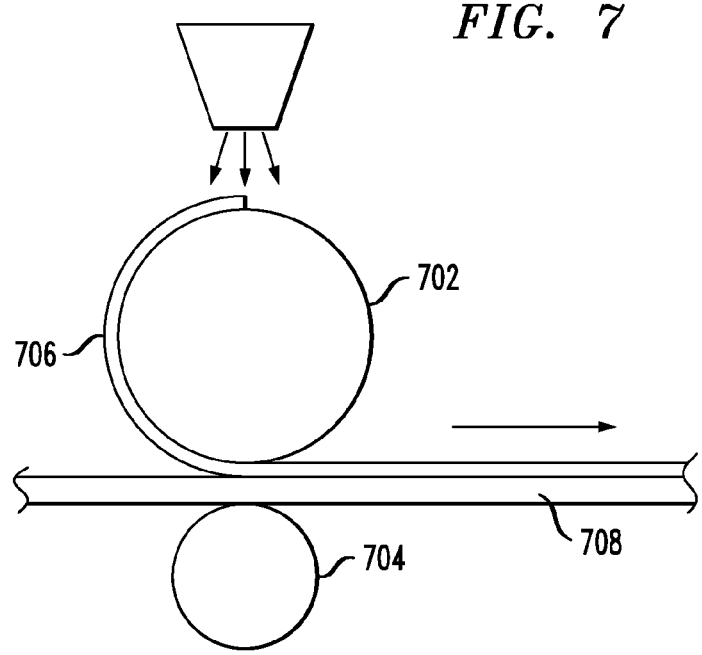
FIG. 7 is a diagram illustrating an alternate embodiment wherein material is deposited onto the rollers using, e.g., a sputtering process, and then transferred to the substrate according to an embodiment of the present invention.

In the examples provided above, deposition of the thin film materials (e.g., Cu, In, Ga, S/Se, etc.) onto the rollers occurs via electrodeposition and/or passage through a molten bath. Other deposition processes may however be employed in accordance with the present techniques. For instance, as shown in FIG. 7, a deposition process, such as spraying, sputtering, and chemical vapor deposition, may be used to deposit the thin film material 706 onto roller 702, which in turn then transfers the material to a substrate 708 under pressure and/or heating/cooling in the manner described above. The rollers 702 and 704 depicted in FIG. 7 generally represent any of the above-described rollers used to apply pressure and/or heat/cool the substrate during thin film deposition. Similarly, the material 706 shown being deposited onto the roller 702 in FIG. 7 generally represents any of the materials described herein for use in the thin film solar cell fabrication process according to the present techniques. The substrate 708 shown in FIG. 7 generally represents any of the (e.g., Mo-coated glass, metal, etc.) substrates described herein which, depending on the particular stage of production, may have one or more layers of thin films already deposited thereon. It is further noted, that combinations of the teachings provided herein can be implemented, if so desired. For instance, one or more of the materials can be deposited via the rollers using electrodeposition and/or transfer from a molten bath (as provided above), and one or more other materials can be deposited via the materials being sprayed, etc. on the rollers (as shown in FIG. 7).

Figure 8:
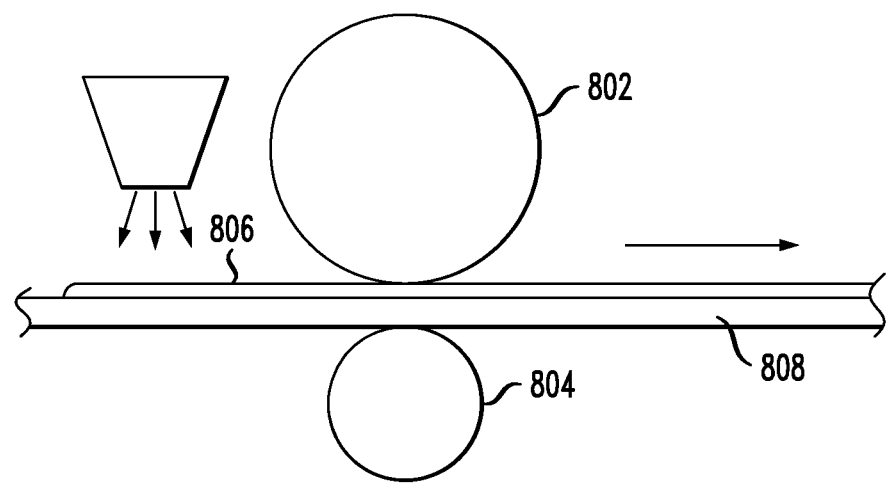
FIG. 8 is a diagram illustrating another alternate embodiment wherein material is deposited directly onto the substrate using, e.g., a sputtering process, and the rollers are used to apply pressure and/or heat according to an embodiment of the present invention.

Alternatively, as shown in FIG. 8, one or more of the thin film materials (e.g., Cu, In, Ga, S/Se, etc.—see above) can be deposited directly onto a substrate and the above-described pressure and/or heating/cooling applied via the rollers. The rollers 802 and 804 depicted in FIG. 8 generally represent any of the above-described rollers used to apply pressure and/or heat/cool the substrate during thin film deposition. Similarly, the material 806 shown being deposited onto the substrate 808 in FIG. 8 generally represents any of the materials described herein for use in the thin film solar cell fabrication process according to the present techniques. The substrate 808 shown in FIG. 8 generally represents any of the (e.g., Mo-coated glass, metal, etc.) substrates described herein which, depending on the particular stage of production, may have one or more layers of thin films already deposited thereon. In this example, any suitable deposition process can be used to deposit the material onto the substrate, including but not limited to spraying, sputtering, and chemical vapor deposition. Further, as shown in FIG. 8, since the rollers will be used to apply pressure, heat, etc., then the material should be deposited onto the substrate prior to the substrate passing between the rollers.

The thin film materials described above are examples provided merely to illustrate the present techniques, and a variety of other film compositions can be achieved in the same manner described herein. One would need only to vary the composition of the materials deposited in one or more of the steps and/or the order in which the materials are deposited in order to achieve different solar cell (or any other device) configurations. By way of example only, one may adapt the present techniques to produce any of the following thin film solar cell compositions: CIGS, CZTS ($Cu_2ZnSn(Se,S)_4$), $FeS_2$, $Zn_2P_3$, CdSe, CdS, ZnSe, $WSe_2$, $MoSe_2$, $Bi_2S_3$, $Ag_2S$, $Cu_2Zn(Fe,Sn)(Se,S)_4$, CuxS, CdTe, ZnTe, PbSe, PdS, NiS, NiSeS, InP, ZnO, GaAs.

For instance, in one exemplary implementation of the present techniques, a I-III-$IV_2$ thin film solar cell is produced. As is known in the art, a I-III-$IV_2$ material includes at least one from group I element, at least one group III element, and at least one group IV element. By way of example only, some I-III-$IV_2$ materials include, but are not limited to, $CuAlGe_2$, $CuGaGe_2$, $CuAlSn_2$, and $CuGaSn_2$. Using $CuGaSn_2$ as an example, the present techniques can be employed to deposit Cu to the substrate, followed by Ga, and finally tin (Sn) all while pressure is applied via the rollers in the manner described above.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method for fabricating a thin film solar cell, the method comprising the steps of:
providing a substrate;
using a first pair of rollers to both i) deposit a first absorber material as a layer A on the substrate while ii) applying pressure to both the substrate and the layer A;
using a second pair of rollers to both i) deposit a second absorber material as a layer B on the layer A while ii) applying pressure to both the substrate and the layer B;
using a third pair of rollers to both i) deposit a third absorber material as a layer C on the layer B while ii) applying pressure to both the substrate and the layer C;
using a fourth pair of rollers to both i) deposit a fourth absorber material as a layer D on the layer C while ii) applying pressure to both the substrate and the layer D; and
annealing the layers A-D while applying pressure to both the substrate and the layer D,
wherein the first absorber material comprises copper, the second absorber material comprises indium, the third absorber material comprises gallium, and the fourth absorber material comprises one or more of sulfur and selenium, and wherein a chalcogenide absorber layer is formed on the substrate, and
wherein the annealing step is performed using a fifth pair of rollers to both i) heat the layers A-D while ii) applying pressure to both the substrate and the layer D.

2. The method of claim 1, wherein the substrate comprises a metal foil substrate.

3. The method of claim 2, wherein the metal foil substrate comprises stainless steel.

4. The method of claim 1, wherein the substrate comprises a glass substrate coated with a molybdenum layer, and wherein the first absorber material is deposited on the molybdenum layer.

5. The method of claim 1, wherein the annealing step is performed at a temperature of from about 500° C. to about 600° C.

6. The method of claim 1, wherein the annealing step is performed in a sulfur-containing environment.

7. The method of claim 1, further comprising the step of:
soft annealing the layers A-C while applying pressure to both the substrate and the layer C,
wherein the soft annealing step is performed using a sixth pair of rollers to both i) heat the layers A-C while ii) applying pressure to both the substrate and the layer C.

8. The method of claim 7, wherein the soft annealing step is performed at a temperature of from about 100° C. to about 300° C.

9. The method of claim 1, wherein the first absorber material is deposited from a chemical or electrochemical solution the method further comprising the step of, following deposition of the layer A on the substrate:
heating the layer A while applying pressure to both the substrate and the layer A.

10. The method of claim 1, wherein the second absorber material is deposited from a chemical or electrochemical solution, the method further comprising the step of, following deposition of the layer B on the layer A:
heating the layer B while applying pressure to both the substrate and the layer B.

11. The method of claim 1, wherein the layer B is deposited from a molten bath, the method further comprising the step of, following deposition of the layer B on the layer A:
cooling the layer B while applying pressure to both the substrate and the layer B.

12. The method of claim 1, wherein the layer C is deposited from a chemical or electrochemical solution, the method further comprising the step of, following deposition of the layer C on the layer B:
heating the layer C while applying pressure to both the substrate and the layer C.

13. The method of claim 1, wherein the layer C is deposited from a molten bath, the method further comprising the step of, following deposition of the layer C on the layer B:
cooling the layer C while applying pressure to both the substrate and the layer C.

14. The method of claim 1, wherein the layer D is deposited from a chemical or electrochemical solution, the method further comprising the step of, following deposition of the layer D on the layer C:
heating the layer D while applying pressure to both the substrate and the layer D.

15. The method of claim 1, wherein the layer D is deposited from a molten bath, the method further comprising the step of, following deposition of the layer D on the layer C:
cooling the layer D while applying pressure to both the substrate and the layer D.

16. The method of claim 1, further comprising the steps of:
depositing the first absorber material onto the first pair of rollers and transferring the first absorber material from the first pair of rollers onto the substrate;
depositing the second absorber material onto the second pair of rollers and transferring the second absorber material from the second pair of rollers onto the layer A;
depositing the third absorber material onto the third pair of rollers and transferring the third absorber material from the third pair of rollers onto the layer B; and
depositing the fourth absorber material onto the fourth pair of rollers and transferring the fourth absorber material from the fourth pair of rollers onto the layer C.

17. The method of claim 16, wherein electrodeposition is used to deposit at least one of: the first absorber material onto the first pair of rollers, the second absorber material onto the second pair of rollers, the third absorber material onto the third pair of rollers, and the fourth absorber material onto the fourth pair of rollers.

18. The method of claim 1, wherein at least one of the first pair of rollers, the second pair of rollers, the third pair of rollers, and the fourth pair of rollers comprises two different sized rollers.

* * * * *